United States Patent
Chan et al.

(10) Patent No.: US 10,735,699 B1
(45) Date of Patent: Aug. 4, 2020

(54) COMPUTER VISION SENSOR

(71) Applicant: QUALCOMM Incorporated, San Diego, CA (US)

(72) Inventors: Victor Chan, Del Mar, CA (US); Edwin Chongwoo Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/502,969

(22) Filed: Jul. 3, 2019

(51) Int. Cl.
*H04N 9/09* (2006.01)
*H04N 9/04* (2006.01)
*H04N 5/235* (2006.01)
*H04N 5/225* (2006.01)

(52) U.S. Cl.
CPC ......... *H04N 9/0451* (2018.08); *H04N 5/2258* (2013.01); *H04N 5/2351* (2013.01)

(58) Field of Classification Search
CPC ... H04N 9/0451; H04N 5/2258; H04N 5/2351
USPC ........................................................ 348/265
See application file for complete search history.

(56) References Cited

U.S. PATENT DOCUMENTS

| | | | |
|---|---|---|---|
| 5,914,749 A | 6/1999 | Bawolek et al. | |
| 6,529,239 B1 | 3/2003 | Dyck et al. | |
| 8,120,680 B2 | 2/2012 | Kim et al. | |
| 2005/0062767 A1* | 3/2005 | Choe | G09G 3/3607 |
| | | | 345/694 |
| 2010/0165149 A1* | 7/2010 | Zimmer | H04N 9/68 |
| | | | 348/234 |
| 2014/0084135 A1 | 3/2014 | Chen et al. | |
| 2015/0332127 A1* | 11/2015 | Zheng | G06K 9/6202 |
| | | | 382/165 |

FOREIGN PATENT DOCUMENTS

EP       1729524 A1     12/2006

* cited by examiner

*Primary Examiner* — Usman A Khan
(74) *Attorney, Agent, or Firm* — Kilpatrick Townsend & Stockton, LLP

(57) ABSTRACT

Embodiments described herein can address these and other issues by providing a CV image sensor that has a repeating pattern of two pairs of color-opponent color sensors and a luminance sensor to provide a high amount of functionality while maintaining relatively low power requirements. By using color opponency, embodiments can sidestep the need for processor-intensive color conversions required of other color sensors. Embodiments may optionally provide for surface area optimization, hyperspectral sensitivity, low-light optimization, neuromorphic light sensing, and more.

30 Claims, 17 Drawing Sheets

1100

1110

In an array of the CV image sensor comprising a repeating pattern of light sensors, causing each light sensor of the array to enter a light-detection mode, wherein:
- Each instance of the repeating pattern of light sensors comprises four color sensors and a luminance sensor, wherein each color sensor is configured to detect a unique respective color of light, and
- The four color sensors comprise:
  - A first pair of color-opponent color sensors configured to detect light from a first pair of opponent colors, and
  - A second pair of color-opponent color sensors configured to detect light from a second pair of opponent colors, different than the first pair of opponent colors

1120

Subsequent to causing each light sensor of the array to enter the light-detection mode, generating, for each instance of the repeating pattern of photosensitive sensors:
- A first value indicative of light detected by the first pair of color-opponent color sensors of the respective instance of the repeated pattern of photosensitive sensors,
- A second value indicative of light detected by the second pair of color-opponent color sensors of the respective instance of the repeated pattern of photosensitive sensors, and
- A third value indicative of light detected by the luminance sensor.

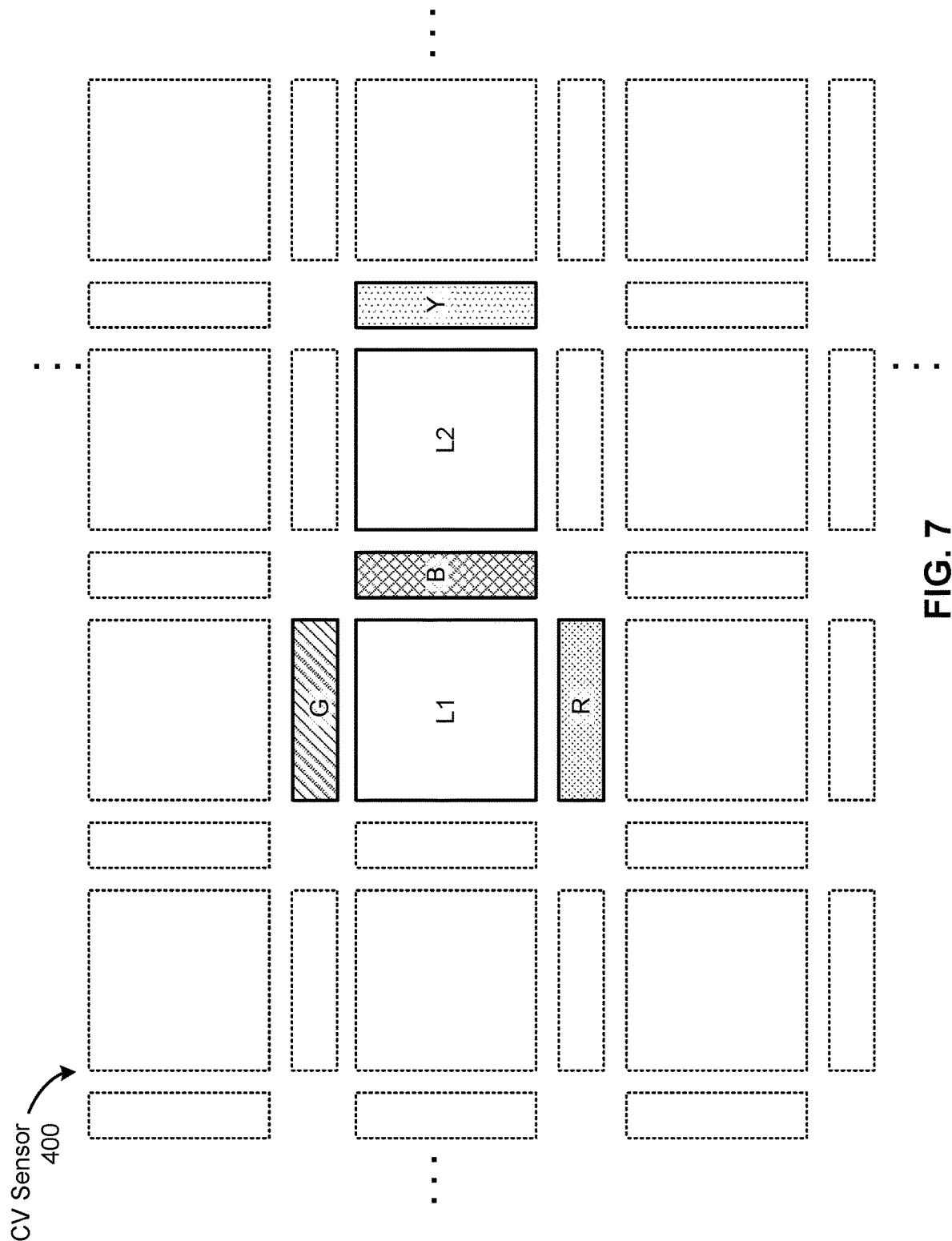

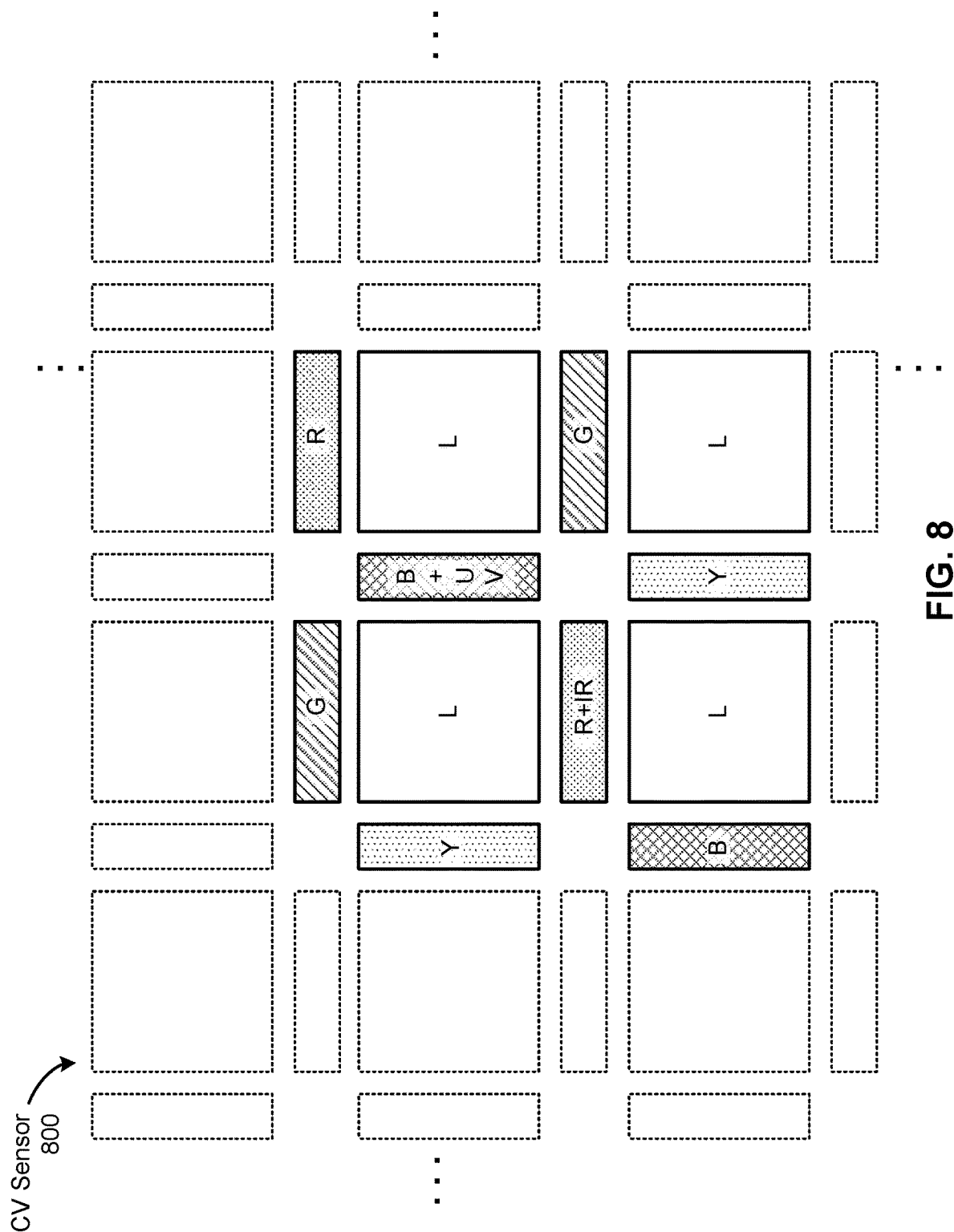

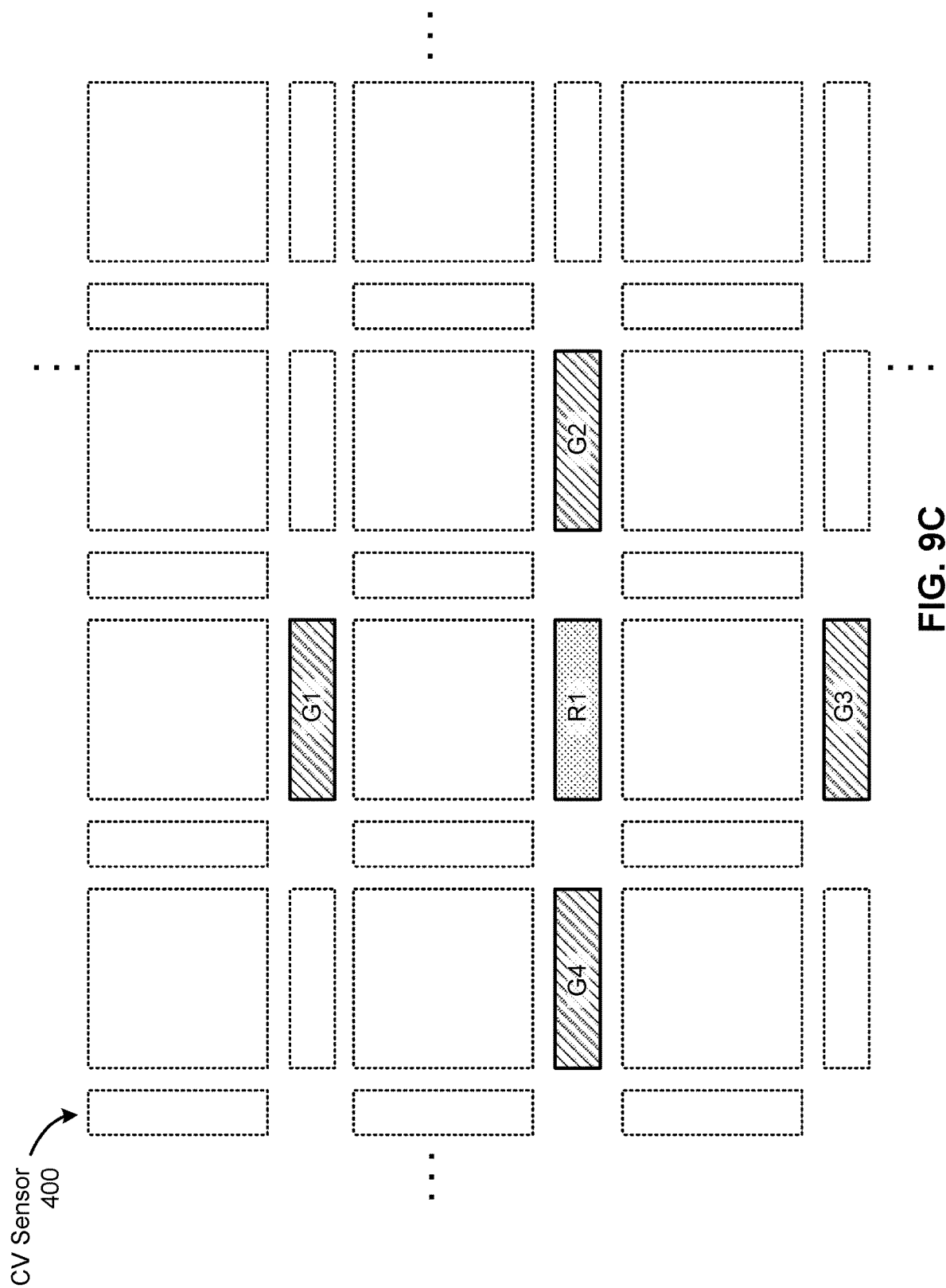

COMPUTER VISION SENSOR

BACKGROUND

The use of color image sensors in computer vision (CV) applications typically results in increased power and processing usage, which is typically undesirable for CV applications on mobile devices, in which battery power is limited. However, limiting CV applications to grayscale images can limit reduce the effectiveness of CV applications in which color detection can be beneficial. Additionally, hyperspectral light, which includes light frequencies outside the visible color spectrum, such as ultraviolet (UV) and infrared (IR), can allow for additional functionality in CV applications.

SUMMARY

Embodiments described herein can address these and other issues by providing a CV image sensor that has a repeating pattern of two pairs of color-opponent color sensors and a luminance sensor to provide a high amount of functionality while maintaining relatively low power requirements. By using color opponency, embodiments can sidestep the need for processor-intensive color conversions required of other color sensors. Embodiments may optionally provide for surface area optimization, hyperspectral sensitivity, low-light optimization, neuromorphic light sensing, and more.

An example computer vision (CV) image sensor, according to the description, comprises an array comprising a repeating pattern of light sensors, wherein each instance of the repeating pattern of light sensors comprises four color sensors and a luminance sensor, wherein each color sensor is configured to detect a unique respective color of light. The four color sensors comprise a first pair of color-opponent color sensors configured to detect light from a first pair of opponent colors, and a second pair of color-opponent color sensors configured to detect light from a second pair of opponent colors, different than the first pair of opponent colors. The CV image sensor further comprises electrical circuitry configured to provide, for each instance of the repeating pattern of light sensors a first value indicative of light detected by the first pair of color-opponent color sensors of the respective instance of the repeating pattern of light sensors, a second value indicative of light detected by the second pair of color-opponent color sensors of the respective instance of the repeating pattern of light sensors, and a third value indicative of light detected by the luminance sensor.

An example method of operating a computer vision (CV) image sensor, according to the description, comprises, in an array of the CV image sensor comprising a repeating pattern of light sensors, causing each light sensor of the array to enter a light-detection mode, wherein each instance of the repeating pattern of light sensors comprises four color sensors and a luminance sensor, wherein each color sensor is configured to detect a unique respective color of light, and the four color sensors comprise a first pair of color-opponent color sensors configured to detect light from a first pair of opponent colors, and a second pair of color-opponent color sensors configured to detect light from a second pair of opponent colors, different than the first pair of opponent colors. The method further comprises, subsequent to causing each light sensor of the array to enter the light-detection mode, generating, for each instance of the repeating pattern of photosensitive sensors a first value indicative of light detected by the first pair of color-opponent color sensors of the respective instance of the repeating pattern of photosensitive sensors, a second value indicative of light detected by the second pair of color-opponent color sensors of the respective instance of the repeating pattern of photosensitive sensors, and a third value indicative of light detected by the luminance sensor.

An example device, according to the description, comprises an array comprising a repeating pattern of light-sensing means, wherein each instance of the repeating pattern of light-sensing means comprises four color-sensing means and luminance-sensing means, wherein each of the four color-sensing means comprises means for detecting a unique respective color of light; and the four color-sensing means comprise a first pair of color-opponent color-sensing means configured to detect light from a first pair of opponent colors, and a second pair of color-opponent color-sensing means configured to detect light from a second pair of opponent colors, different than the first pair of opponent colors. The device further comprises means for providing, for each instance of the repeating pattern of light-sensing means a first value indicative of light detected by the first pair of color-opponent color-sensing means of the respective instance of the repeating pattern of light-sensing means, a second value indicative of light detected by the second pair of color-opponent color-sensing means of the respective instance of the repeating pattern of light-sensing means, and a third value indicative of light detected by the luminance-sensing means.

An example non-transitory computer-readable medium, according to the description, has instructions thereon for operating a computer vision (CV) image sensor. The instructions, when executed by one or more processors, cause the one or more processors to, in an array of the CV image sensor comprising a repeating pattern of light sensors, cause each light sensor of the array to enter a light-detection mode. Each instance of the repeating pattern of light sensors comprises four color sensors and a luminance sensor, wherein each color sensor is configured to detect a unique respective color of light, and the four color sensors comprise a first pair of color-opponent color sensors configured to detect light from a first pair of opponent colors, and a second pair of color-opponent color sensors configured to detect light from a second pair of opponent colors, different than the first pair of opponent colors. The instructions, when executed by the one or more processors, further cause the one or more processors to, subsequent to causing each light sensor of the array to enter the light-detection mode, generate, for each instance of the repeating pattern of photosensitive sensors a first value indicative of light detected by the first pair of color-opponent color sensors of the respective instance of the repeating pattern of photosensitive sensors, a second value indicative of light detected by the second pair of color-opponent color sensors of the respective instance of the repeating pattern of photosensitive sensors, and a third value indicative of light detected by the luminance sensor.

BRIEF DESCRIPTION OF THE DRAWINGS

FIG. 7 is a top view of a CV sensor, illustrating how photosensitive sensors may be grouped to provide low-light mode sensitivity.

FIG. 8 is an overhead view of a CV sensor, capable of hyper-spectral sensitivity, according to an embodiment.

FIGS. 9A-9D are overhead views of a CV sensor, showing center-surround functionality, according to an embodiment.

Like reference symbols in the various drawings indicate like elements, in accordance with certain example implementations. In addition, multiple instances of an element may be indicated by following a first number for the element with a letter or a hyphen and a second number. For example, multiple instances of an element 110 may be indicated as 110-1, 110-2, 110-3 etc. or as 110a, 110b, 110c, etc. When referring to such an element using only the first number, any instance of the element is to be understood (e.g., element 110 in the previous example would refer to elements 110-1, 110-2, and 110-3 or to elements 110a, 110b, and 110c).

DETAILED DESCRIPTION

Several illustrative embodiments will now be described with respect to the accompanying drawings, which form a part hereof. The ensuing description provides embodiment(s) only, and is not intended to limit the scope, applicability or configuration of the disclosure. Rather, the ensuing description of the embodiment(s) will provide those skilled in the art with an enabling description for implementing an embodiment. It is understood that various changes may be made in the function and arrangement of elements without departing from the spirit and scope of this disclosure.

It can be further noted that, although embodiments described herein are described in the context of CV applications, embodiments are not so limited. Embodiments may be used for other imaging applications.

Figure 1A:
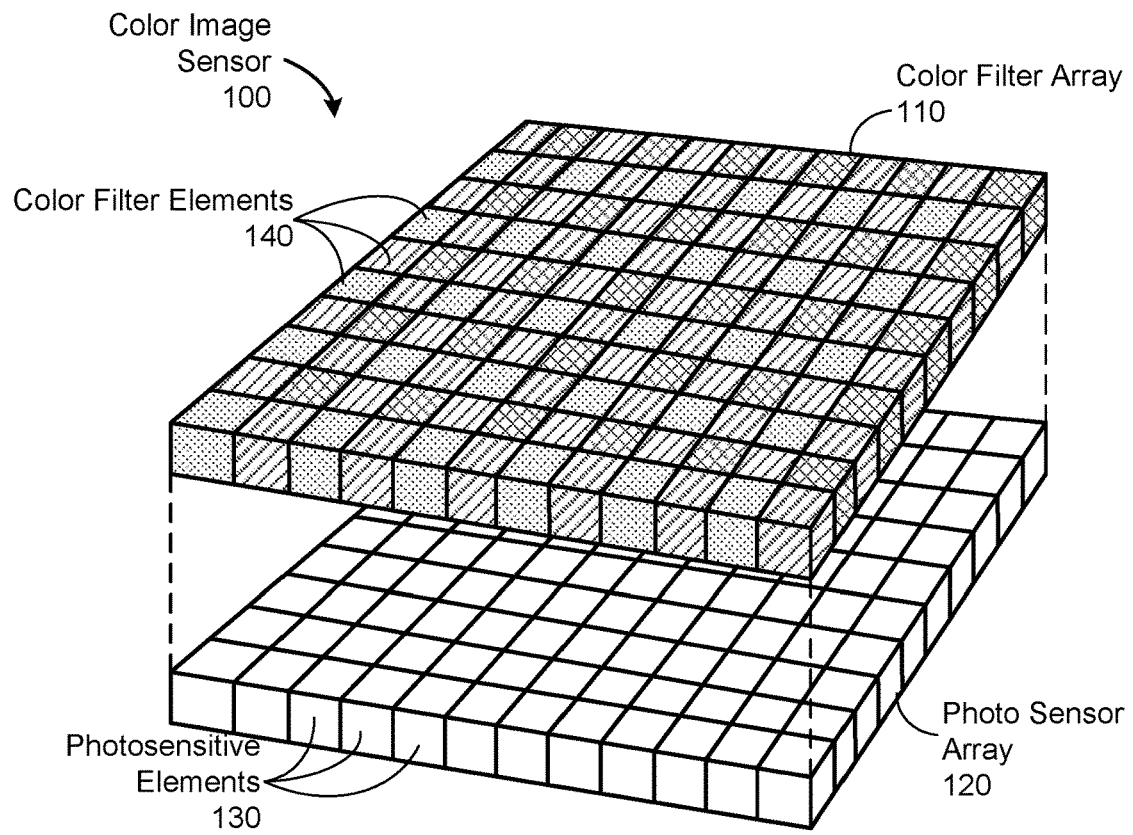
FIG. 1A is an exploded view of a traditional color image sensor, comprising a color filtered array and a photo sensor array.
Figure 1B:
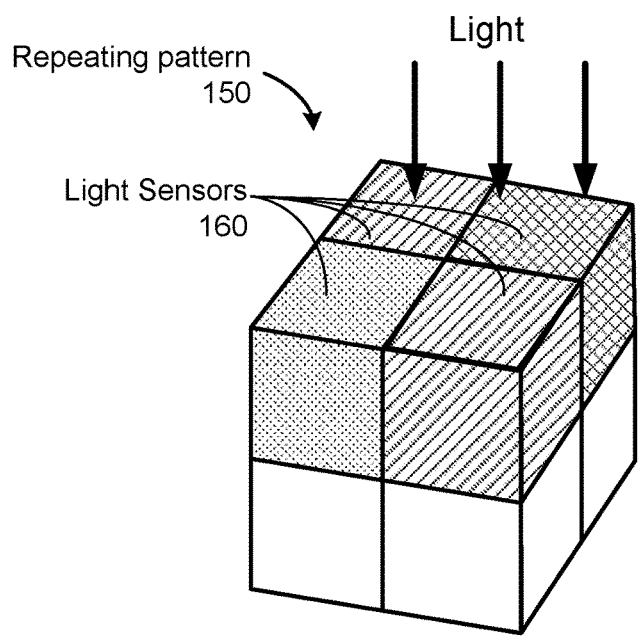
FIG. 1B is a close-up view of a repeating pattern of color sensors of the color image sensor of FIG. 1A.

Additionally, as used herein, the term "color," "chrominance," "colorance," and similar terms are intended to refer to a band of visible and/or hyperspectral (IR and UV) light frequencies detectable by a color filter array and CMOS photo sensor array and/or similar technologies. As an example, "red" may refer to light frequencies falling within the range of 640-700 nm, "yellow" may refer to light frequencies falling within the range of 560-580 nm, "green" may refer to light frequencies falling within the range of 490-560 nm, and "blue" may refer to light frequencies falling within the range of 430-490 nm. IR may refer to light having wavelengths greater than 700 nm (e.g., 700 nm-1 mm), but smaller than wavelengths of microwaves. UV wavelengths may refer to wavelengths smaller than 400 nm (e.g., 10-400 nm), but larger than wavelengths of x-rays. The term "luminance," as used herein, refers to color-agnostic light detection, which may be detected by a CMOS array without color filtration. As referred to herein, "color sensors" are light sensors (or photosensitive sensors) capable of detecting a particular color of light (e.g., acting as a band-pass filter), and "luminance sensors" are color-agnostic photosensitive sensors capable of sensing light over a wider range of wavelengths than color sensors. As explained in further detail below, luminance sensors may not filter any visible light (e.g., wavelengths from 400-700 nm. (Luminance sensors may filter some non-visible wavelengths. For example, luminance sensors may include an IR block filter, in some embodiments.) FIGS. 1A and 1B illustrate an embodiment of an image sensor providing such color filtration.

FIG. 1A is an exploded view of a traditional color image sensor 100, comprising a color filtered array 110 and a photo sensor array 120. Here, the photo sensor array 120 comprises an array of light sensors 130 capable of luminance (achromatic) light detection during an exposure period and producing a value (e.g., a voltage) indicative of the amount of light detected during the exposure period. (For clarity, only portions of the light sensors 130 are labeled.) Light sensors 130 may be implemented using CMOS and/or other photosensitive technologies. Once the light sensors 130 generate respective exposure values, the values can then be read and used by electrical circuitry (not shown) to process the image.

To provide color detection, the color filter array 110 is overlaid on the photo sensor array 120 such that each filter element 140 in the color filter array 110 aligns with a respective sensor of the photosensor array 120. (Again, only a portion of color filter elements 140 are labeled.) This is illustrated in FIG. 1B.

FIG. 1B is a close-up view of a repeating pattern 150 of color sensors 160 of the color image sensor 100 of FIG. 1A. Here, color sensors 160 refers to the combination of color filter elements 140 and respective light sensors 130. Light is detected by entering the color sensors 160 from a top surface, as shown. Light that is not filtered by each color filter element 140 of the color sensor 160 is then detected by the underlying light sensor 130. The repeating pattern 150 includes color filter elements 140 chosen for the desired color application.

Figure 2:
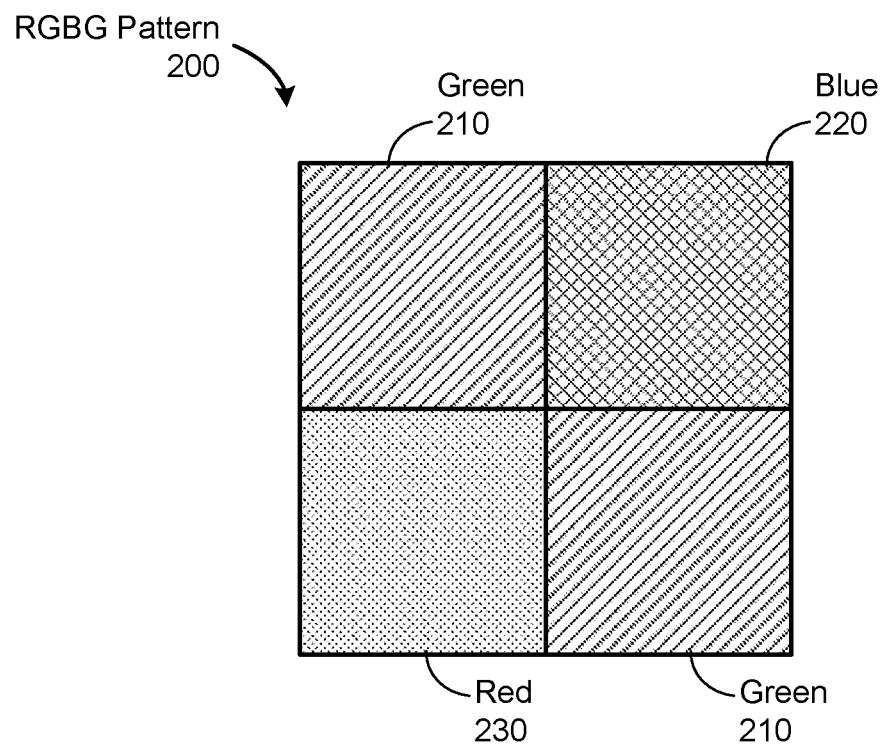
FIG. 2 is a top view of an RGBG Pattern of color sensors (also known as a Bayer pattern), which is used in a variety of color filter arrays.

FIG. 2 is a top view of an RGBG Pattern 200 of color sensors (also known as a Bayer pattern), which is used in a variety of color filter arrays 110. A single instance of the RGBG Pattern 200 comprises a single red green blue (RGB) color pixel including two green color sensors (labeled simply as "green 210"), a blue color sensor ("blue 220"), and a red color sensor ("red 230"). The duplicate green 210 is meant to mimic the human eyes extra sensitivity to green light.

Although satisfactory for many applications, this RGBG pattern 200 (and image sensors with similar patterns) can be limiting in CV applications in various ways. For example, because the RGBG pattern 200 produces an RGB output with separate values for red (R), green (G), and blue (B). There is no separate luminance value, and thus, luminance is mixed with colorance. (The RGBG pattern 200 therefore has diminished low light capabilities as compared with patterns including luminance sensors, because R, G, and B filters reduce the amount of light sensed.) For CV applications involving color matching, this can be particularly processing intensive. For example, the color "gray" in RGB means matching values for R, G, and B. Thus, to match the color "gray" in the RGB color space, and algorithm must compare a color with all variants of gray in RGB: (128, 128, 128), (127, 127, 127) . . . (1, 1, 1). In contrast, matching the color in the YUV color space (where Y is a luminance value and U and V are colorance values), simply involves checking the YUV color space for (x, 0, 0), where x is any value. (It should be noted that, although the letter "Y" represents a luminance value in the YUV standard color space, the letter "Y" is used later herein to represent the color yellow, as will be apparent in context.)

Because of this limitation in the RGB color space, CV applications often convert RGB values detected by a color image sensor with the RGBG pattern 200 to the YUV color space. Performing this operation (a matrix multiplication) for each pattern in a color image sensor adds additional complexity and power consumption, which can be particularly problematic for low-power applications. Not only this, because the RGBG pattern 200 uses color filtering for all photosensitive sensors, it has a relatively low quantum efficiency. That is, because the color filter element of each color sensor filters out one third of the light, only one third of the energy of the light illuminating the color sensors of the RGBG pattern 200 is detected.

Embodiments of a CV image sensor herein address these and other issues by directly sensing color and luminance values that can be used in CV applications. More specifically, a CV image sensor comprises a repeating pattern of photosensitive sensors with both color and luminance sensors that capture usable color and luminance values with much less additional processing requirements, as compared with the RGBG pattern 200 (and other RGB patterns).

Figure 3:
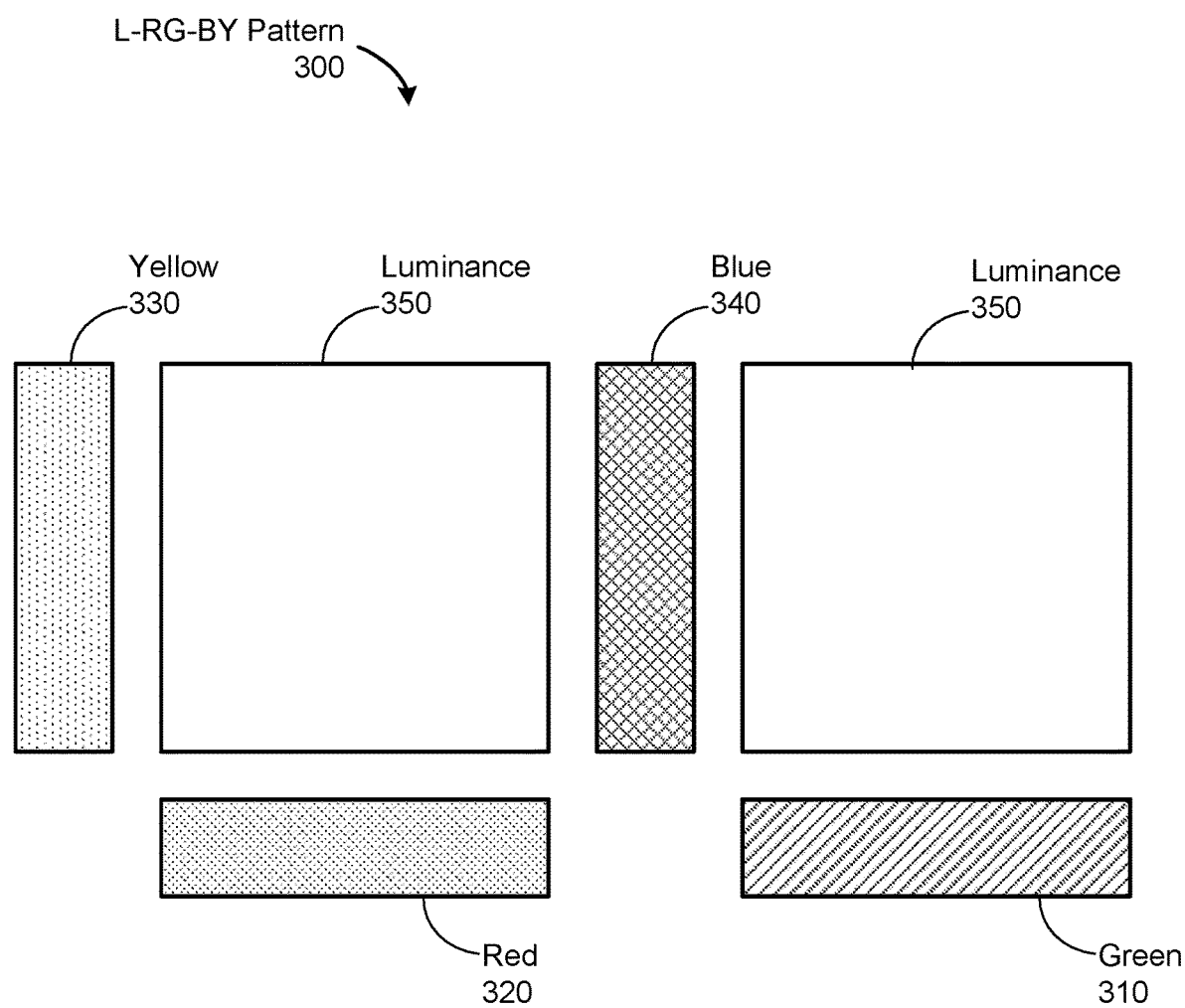
FIG. 3 is an overhead view of an example luminance-red/green-blue/yellow (L-RG-BY) pattern for a CV image sensor, according to an embodiment.
Figure 4:
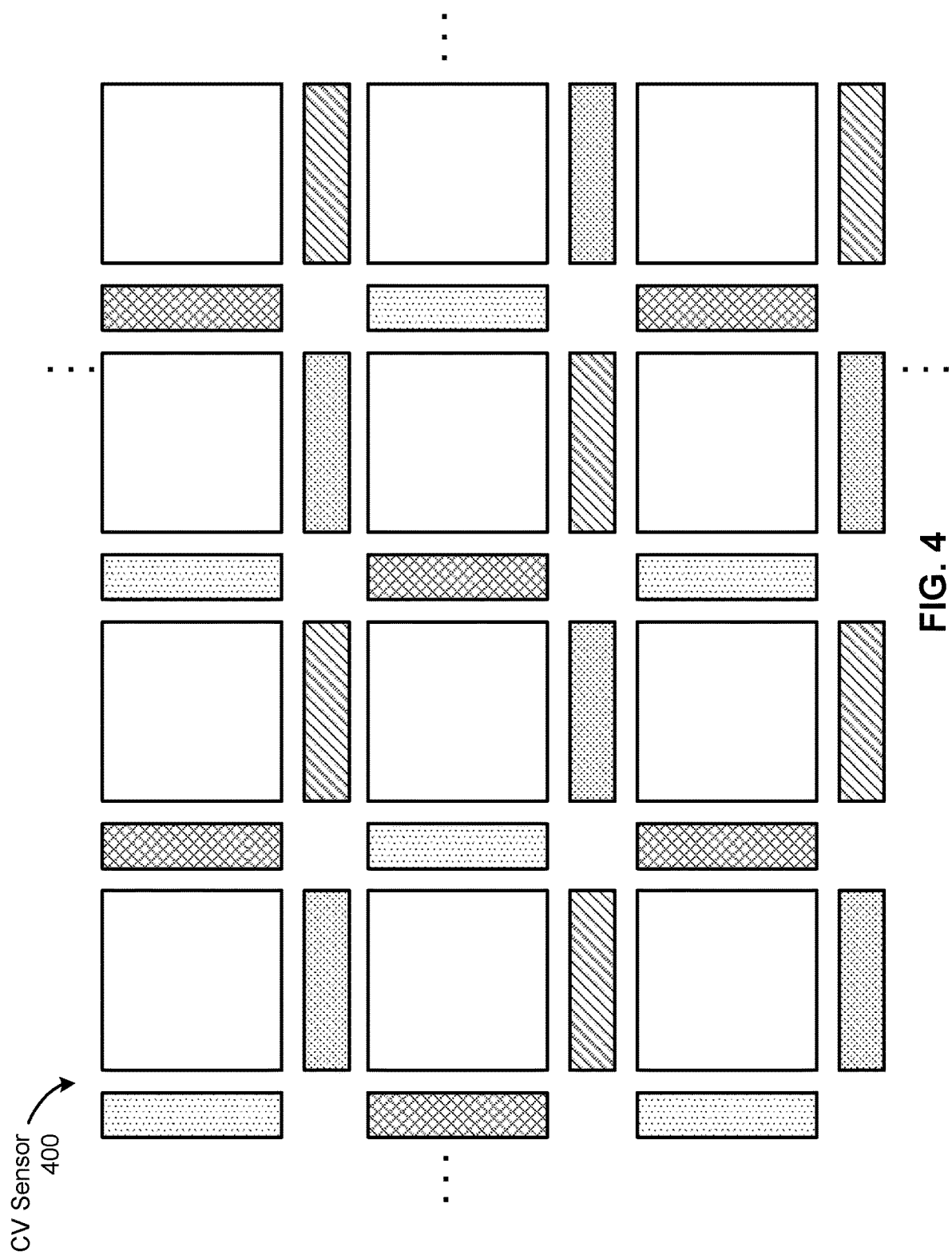
FIG. 4 is an overhead view of a portion of a CV sensor, which shows how the L-RG-BY pattern may be repeated, according to an embodiment.

FIG. 3 is an overhead view of an example luminance-red/green-blue/yellow (L-RG-BY) pattern 300 for a CV image sensor, according to an embodiment. Here, the L-RG-BY pattern 300 comprises four color sensors: one green 310, one red 320, one yellow 330, and one blue 340. The CV pattern 300 also comprises to luminance sensors: luminance 350. FIG. 4 is an overhead view of a portion of a CV sensor 400, which shows how the L-RG-BY pattern 300 may be repeated, according to an embodiment.

It will be understood that alternative embodiments may vary in any of a variety of ways. For example, the relative sizes of green 310, red 320, yellow 330, and a blue 340 may vary with respect to each other and/or luminance 350. The shapes, location, and/or relative distance of the sensors may vary as well, and may be restricted by manufacturing and/or similar factors. Moreover, as explained in further detail below, the colors sensed by the color filters may also vary.

The L-RG-BY pattern 300 illustrated in FIG. 3 differs from the RGBG pattern 200 in several aspects. For one, the L-RG-BY pattern 300 can have much higher quantum efficiency than the RGBG pattern 200. As noted above, the RGBG pattern 200 has relatively low quantum efficiency. Because the color filter element of each of the color sensors filters one third of the light detectable by the underlying light sensors, the RGBG pattern 200 ultimately loses 66% of detectable light. The L-RG-BY pattern 300, on the other hand, may lose approximately 25%. Although the use of four color sensors (instead of three) results in a higher percentage of light filtration by each of the of the four color sensors (approximately 75%), the use of dedicated luminance sensors 350 in the L-RG-BY pattern 300 significantly increases the overall quantum efficiency. Each luminance 350 has much higher quantum efficiency, because there is no light filtration (of visible light). Furthermore because each luminance 350 is relatively large, it increases the overall quantum efficiency of the L-RG-BY pattern 300. Here, the surface area of a single luminance 350 has the same surface area of all four color sensors. Thus, with two luminance sensors 350, the quantum efficiency of the L-RG-BY pattern 300 is greatly increased, filtering only 25% of the visible light. Thus, the L-RG-BY pattern 300 may have greater light sensitivity, which can be particularly beneficial in many CV applications.

The L-RG-BY pattern 300 also creates different luminance and colorance values that, as explained above, can be used more efficiently by CV applications. There is no need, therefore, to perform calculations to convert the captured colors to a more usable color space, as is the case with the RGBG pattern 200 (and other patterns that result in mixing luminance and colorance). Similar to the YUV color space, the L-RG-BY pattern 300 results in a L-RG-BY color space that uses one luminance channel and two color channels. However, unlike YUV, the two color channels use color opponency, which can be particularly beneficial in CV applications.

Figure 5:
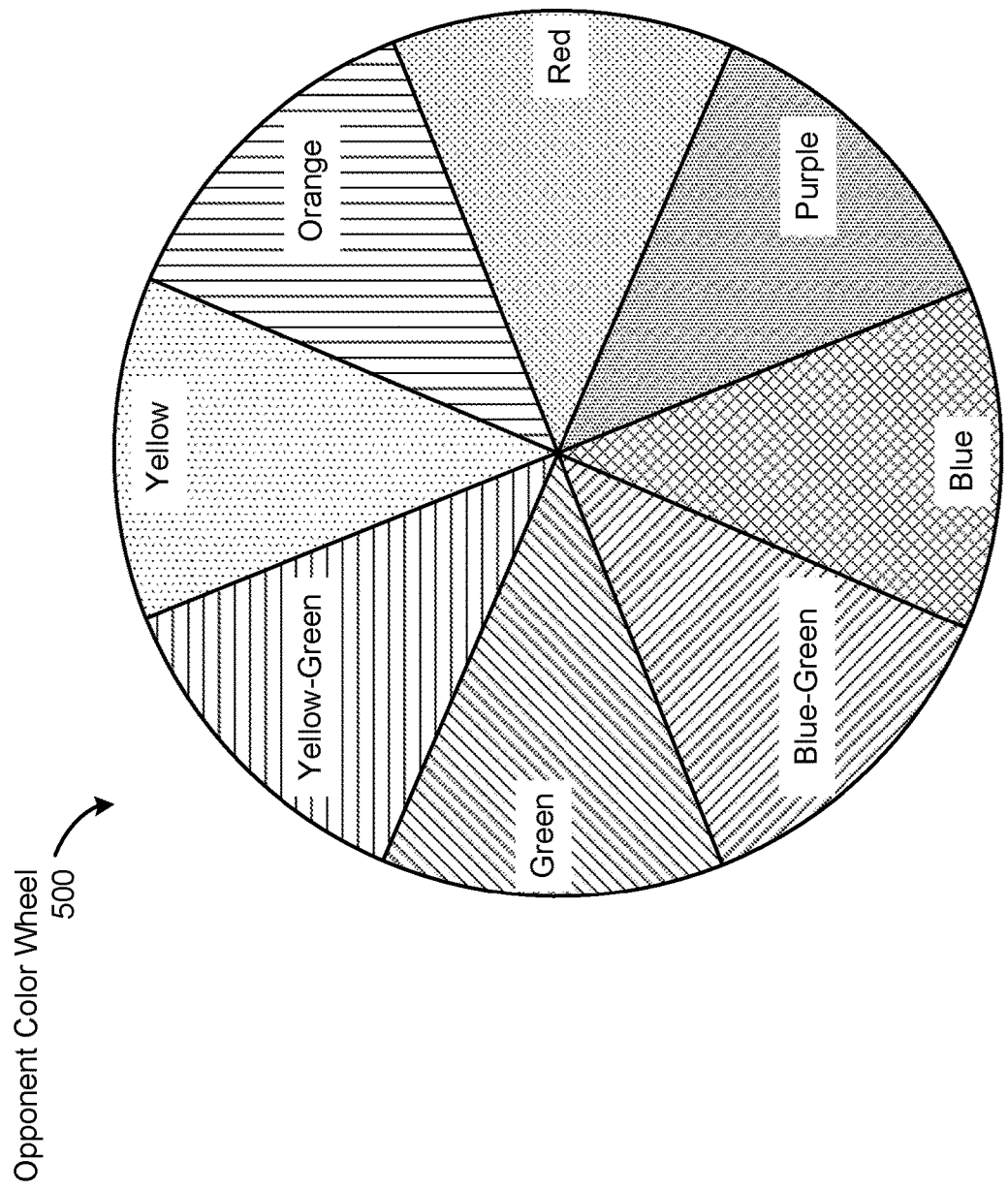
FIG. 5 is an illustration of an opponent color wheel, which illustrates how various colors may be perceived as "opponents" by the human eye.

FIG. 5 is an illustration of an opponent color wheel 500, which illustrates how various colors may be perceived as "opponents" by the human eye. (Due to the limitations of figure reproduction in patents, the figures provided in black and white, with labels where colors would appear on the opponent color wheel 500.) They can be noted that, although only eight hues are illustrated in the opponent color wheel 500 of FIG. 5, opponent colors can be far more granular, resulting in a continuum of different colors. As such, there is a countless number of color opponent pairs.

Color opponency is based on the phenomenon that the human visual system has intrinsic color "opposites" because it determines information about color by processing signals from cones and rods in an antagonistic matter. Because of this, the human eye does not perceive "greenish red" or "yellowish blue." Color opponents are found on opposite sides of the opponent color wheel 500. As can be seen, red and green are opposites, as are blue and yellow. Furthermore, the because red/green and blue/yellow opponencies are approximately orthogonal on the color wheel, values of these opponent pairs can be used to describe any hue on the color wheel 500.

With this in mind, the L-RG-BY pattern 300 of FIG. 3 utilizes color sensors green 310, red 320, yellow 330, and blue 340. However, alternative embodiments may utilize different color-opponent pairs, such as yellow-green/purple and/or blue-green/orange.

Figure 6:
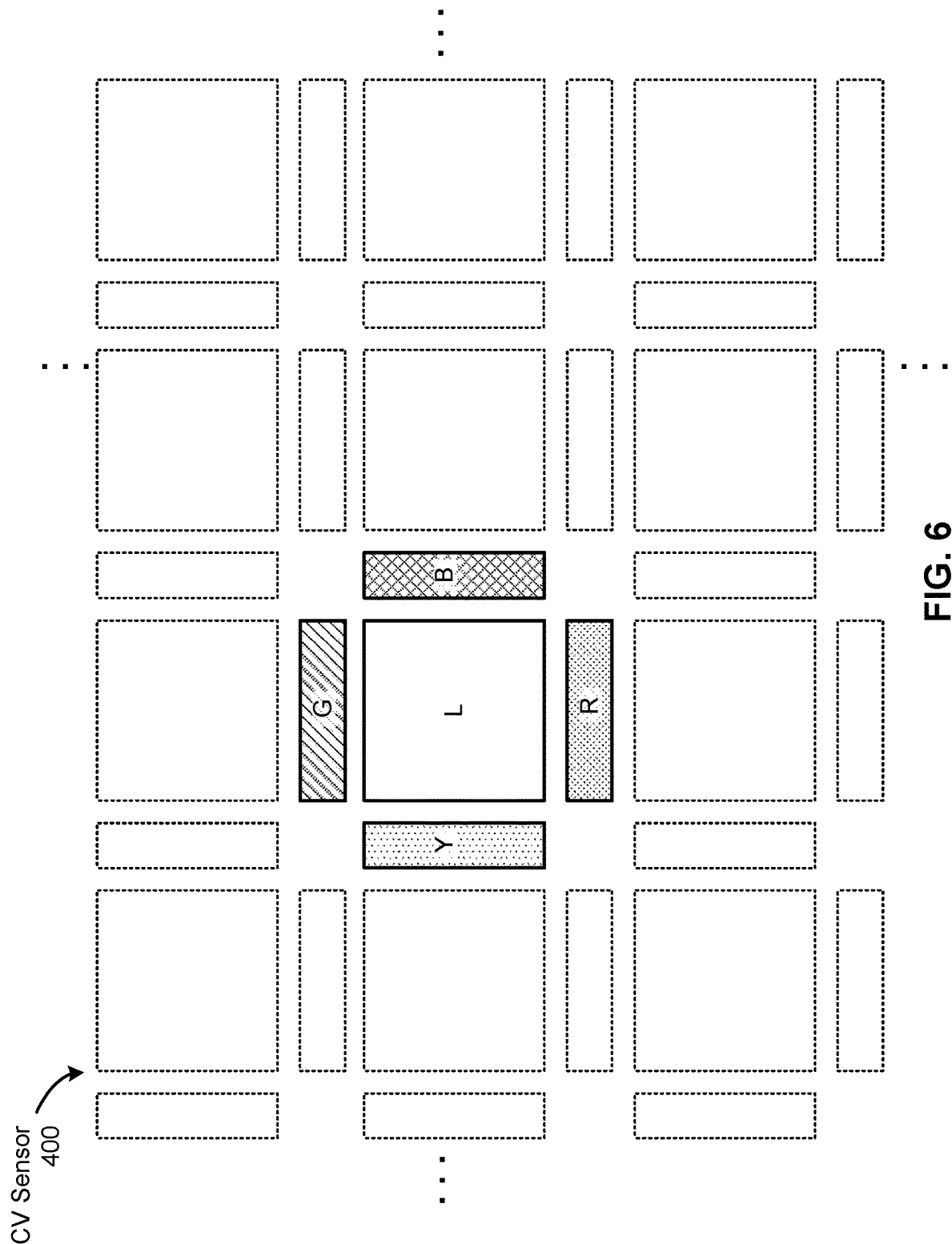
FIG. 6 is an overhead view of the CV sensor, highlighting a single luminance sensor and each type of color sensor.

FIG. 6 is an overhead view of the CV sensor 400, highlighting a single luminance sensor and each type of color sensor. To avoid clutter, red, blue, green, and yellow color sensors have been respectively labeled R, B, G, and Y; and luminance sensor has been labeled L1. Sensing light in the L-RG-BY color space using these sensors can be done in different ways.

For example, according to a "difference-based" formulation, for example, color channels in the L-RG-BY color space are formulated from the difference between exposure values of opponent colors. That is:

$$RG = R - G, \tag{1}$$

where R and G are exposure values for red and green color sensors, and RG is the value of the RG color channel of the L-RG-BY color space. Similarly:

$$BY = B - Y, \tag{2}$$

where B and Y are exposure values for red and green color sensors, and BY is the value of the BY color channel of the L-RG-BY color space. Finally, the luminance value, L, of the L-RG-BY space can simply be equal to the exposure value of the luminance sensor.

The circuitry for processing exposure values for this "difference-based formulation" may simply comprise a differential amplifier, where the exposure values for each color sensor of a color opponent pair is provided to the differential amplifier, which outputs the difference between the two values.

Alternatively, embodiments may utilize a "ratio-based formulation" in which color channels in the L-RG-BY color space are formulated from the ratio between exposure values of opponent colors. That is, instead of channels RG and BY being formulated in accordance with (1) and (2) above, they may be formulated as follows:

$$RG = R/G, \quad (3)$$

and $$BY = B/Y, \quad (4)$$

Using the ratio of color opposites in this manner, as opposed to taking the difference, may involve using different circuitry. Here, logarithmic amplifiers could perform the computations of (3) and (4). In embodiments in which the normalization of circuitry is desirable (e.g., due to limited space, manufacturing concerns, or the like), ratio-based formulation may be preferable to difference-based formulation because the circuitry (e.g., logarithmic amplifiers) is cheaper and/or smaller for ratio-based formulation than for difference-based formulation. An additional advantage of ratio-based formulation is that it can further build in for normalization of the exposure values. It will be understood that, with either difference-based formulation or ratio-based formulation, the associated circuitry can be analog and/or digital.

In addition or as an alternative to normalizing exposure values for each of the color sensors, embodiments may employ physical normalization in which the size of the various color sensors in a CV sensor 400 are properly proportions to account for the dynamic range of the underlying light sensor to observe that particular light. For example, due to the underlying physical processes by which a color sensors absorb light, color sensor B may absorb blue light more poorly then color sensor Y absorbs yellow light. To normalize the exposure values of B and Y physically (e.g., in addition or as an alternative to normalization via circuitry), the surface area of the B and Y color sensors can be adjusted accordingly, increasing the surface area of B and/or decreasing the surface area of Y so that a proper ratio is achieved between the two opponent colors. Sensors G and R can be proportioned the same way. Normalization (or other desired output voltage adjustments) may be additionally or alternatively done by doping the underlying photosensitive elements to cause them to have a lower quantum efficiency. In some embodiments, electrical circuitry may be located on areas of a CV sensor unused by light sensors, which can result in a more efficient use of space on the CV sensor.

For example, because CMOS light sensors detect red and yellow light roughly twice as well as green and blue light, the pixel size (surface area) of each color sensor for embodiments utilizing CMOS light sensors can be determined as:

$$P_G = 2 * P_R \quad (5)$$

and $$P_B = 2 * P_Y, \quad (6)$$

where $P_G$, $P_R$, $P_B$, and $P_Y$ are the surface areas of color sensors G, R, B, and Y, respectively.

Although embodiments shown in the appended figures illustrate L as being approximately 4 times larger than each of the color sensors R, G, B, and Y, embodiments are not so limited. Although providing a large L increases quantum efficiency and low light sensitivity, some embodiments may use a smaller L, with respect to the color sensors. That said, some embodiments may have a larger L, such as in applications where increased light sensitivity is a priority.

Embodiments may further allow for enhanced sensitivity during the low-light conditions. That is, embodiments may provide for a low-light mode in which exposure values for color sensors can be added to exposure values of luminance sensors. FIG. 7 is an illustration used to provide additional details.

FIG. 7 is a top view of a CV sensor 400, illustrating how photosensitive sensors may be grouped to provide low-light mode sensitivity. Here, the photosensitive sensors include luminance sensors L1 and L2, and color sensors R, G, B, and Y. Other photosensitive sensors in the CV sensor 400 may be grouped similarly.

In low-light conditions (in which color channels are typically not used), luminance sensors are used to sense light. However, instead of ignoring exposure values on color sensors, embodiments may "boost" the exposure values of luminance sensors by adding exposure values of neighboring color sensors to them. For example, to provide a boost in sensitivity to luminance sensor L1, neighboring color sensors R and G may be added to the exposure value of L1. Similarly, exposure values for B and Y can be added to the exposure value of L2. In other words, boosted luminance values for L1 and L2 can be calculated as:

$$L1' = L1 + G + R \quad (7)$$

and $$L2' = L2 + B + Y, \quad (8)$$

where L1' and L2' are the boosted luminance values for L1 and L2, respectively. The resulting boosted luminance values can give the CV sensor 400 increased sensitivity and low-light conditions.

In bright conditions, the CV sensor 400 can use color sensors to operate in a high dynamic range (HDR) mode. Referring again to sensor grouping illustrated in FIG. 6, G and Y can be used to detect luminance with lower sensitivity than L (due to light filtering), and thus, exposure values from G and Y may be used to adjust the value of L if L saturates.

For example, if the exposure value of L saturates (e.g., has a value of 255), exposure values of G and Y may be used because each filters out 75% of the light, and may therefore not be subject to saturation. Thus, in some embodiments, when the exposure value of L saturates, the values of Y and G can be used to set the most significant byte (or in the number of most significant bits) for the exposure value of L. The modified exposure value, L', can be set as:

$$L' = ((Y >> 4 + G >> 4) << 4) \& L \quad (9)$$

That is, the largest four bits of Y and G can be added, then used to replace the largest four bits of L. (Again, alternative embodiments may use a larger or smaller number of bits than 4.) It can be noted that although color sensors B and R may be used for HDR functionality in a similar manner as G and Y, B and R are located near the edges of the visible spectrum and are therefore not as great and approximate or for luminance as G and Y.

FIG. 8 is a top view of a CV sensor 800, capable of hyper-spectral sensitivity, according to an embodiment. Here, color sensors are different than the CV sensor 400 of FIG. 4 in that approximately 50% of B color sensors are additionally capable of detecting UV light (and hence are labeled B+UV). Similarly, approximately 50% of R color sensors are additionally capable of detecting IR light (and hence are labeled R+IR). In some embodiments, B+UV and R+IR sensors may replace every other B and IR sensor, respectively, as illustrated in FIG. 8.

Although some embodiments may replace all R color sensors with R+IR, and all be color sensors with B+UV, using a 50/50 split of normal/hyperspectral color sensors in this manner can provide for pure IR and pure UV sensitivity. For example, pure IR can be determined from the difference between exposure values of R+IR with exposure values of R. Similarly, pure UV can be determined from the difference between exposure values of B+UV with exposure values of B. In some embodiments, R+IR and B+UV can also be useable independently, depending on desired functionality.

It can be noted that other considerations may need to be taken into account for hyperspectral sensitivity. For example, hyperspectral bandwidths need to be detectable by underlying light sensors (e.g., CMOS sensors) and may require special color filtering. Moreover, the camera using the CV sensor 800 may need to use special lenses that are highly transparent for all wavelengths of light to be detected.

Some embodiments may be capable of providing a center-surround demosaic, providing neuromorphic hardware similar to receptive fields in the human retina. FIGS. 9A-9D are images of a CV sensor 400 that help illustrate this center-surround functionality.

Figure 9A:
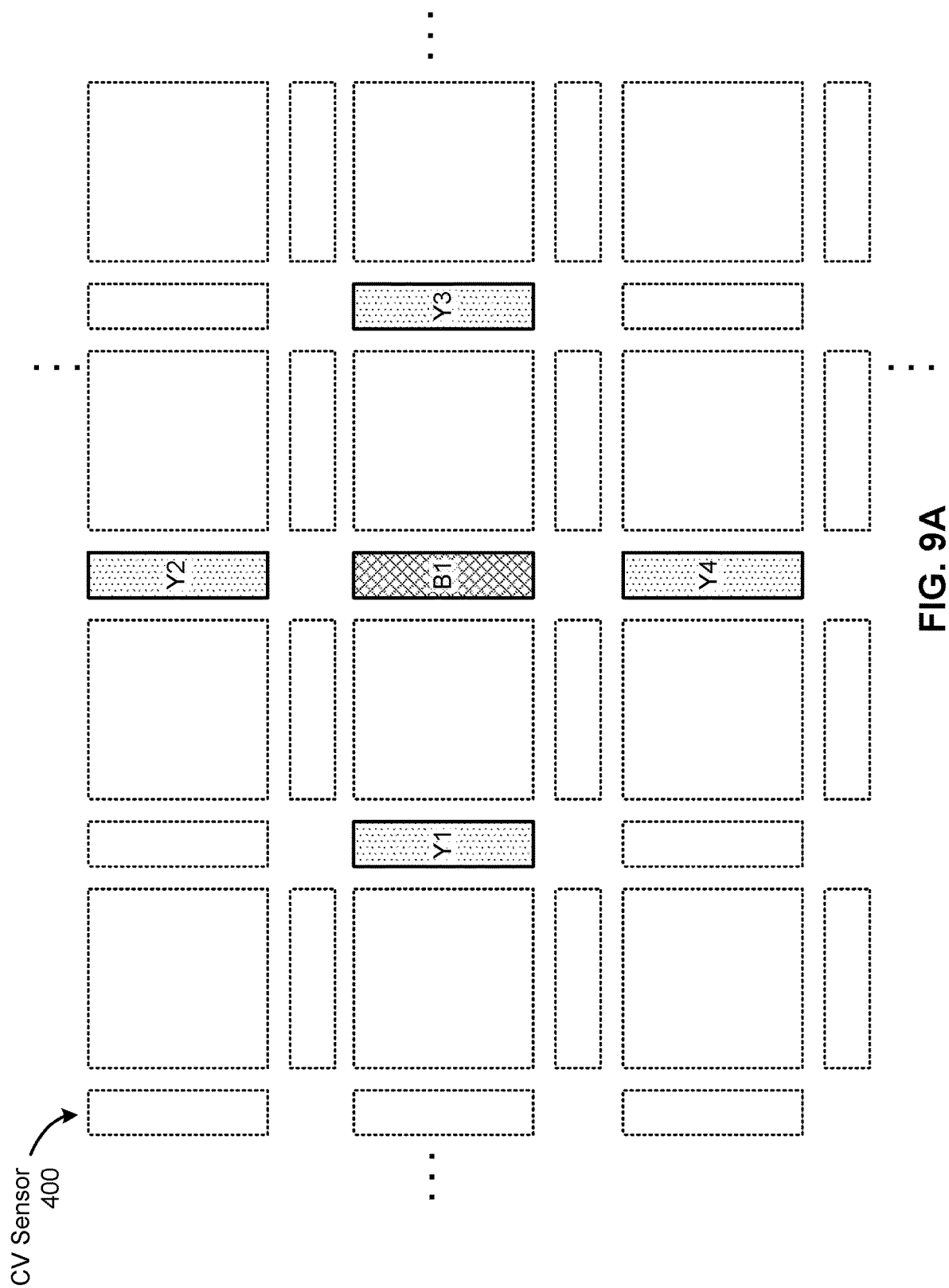

FIG. 9A is a top view of a CV sensor 400, where in a center blue color sensor, B1, is surrounded by color-opposite (yellow) color sensors Y1-Y4. Together, these color sensors can provide a center-surround pixel that mimics portions of the retina, where neural activity is triggered by a contrast between center and surround colors. More specifically, a center color detection provides a positive or negative value, and the surround provides a value of the opposite color, providing a resulting signal. In this way, the CV sensor 400 can be used to mimic the human retina, enabling applications utilizing the CV sensor 400 to "see" optical illusions that humans see, that other image sensors may not be able to detect.

According to some embodiments, some eight center-surround pixels can be utilized: BY_on, BY_off, YB_on, YB_off, RG_on, RG_off, GR_on, and GR_off. FIG. 9A illustrates the color sensors that can be utilized for the first two center-surround pixels: BY_on and BY_off, which can be calculated as:

$$BY_{on} = B1 - \frac{Y1 + Y2 + Y3 + Y4}{4} \tag{10}$$

and $$BY_{off} = \frac{Y1 + Y2 + Y3 + Y4}{4} - B1. \tag{11}$$

Figure 9B:
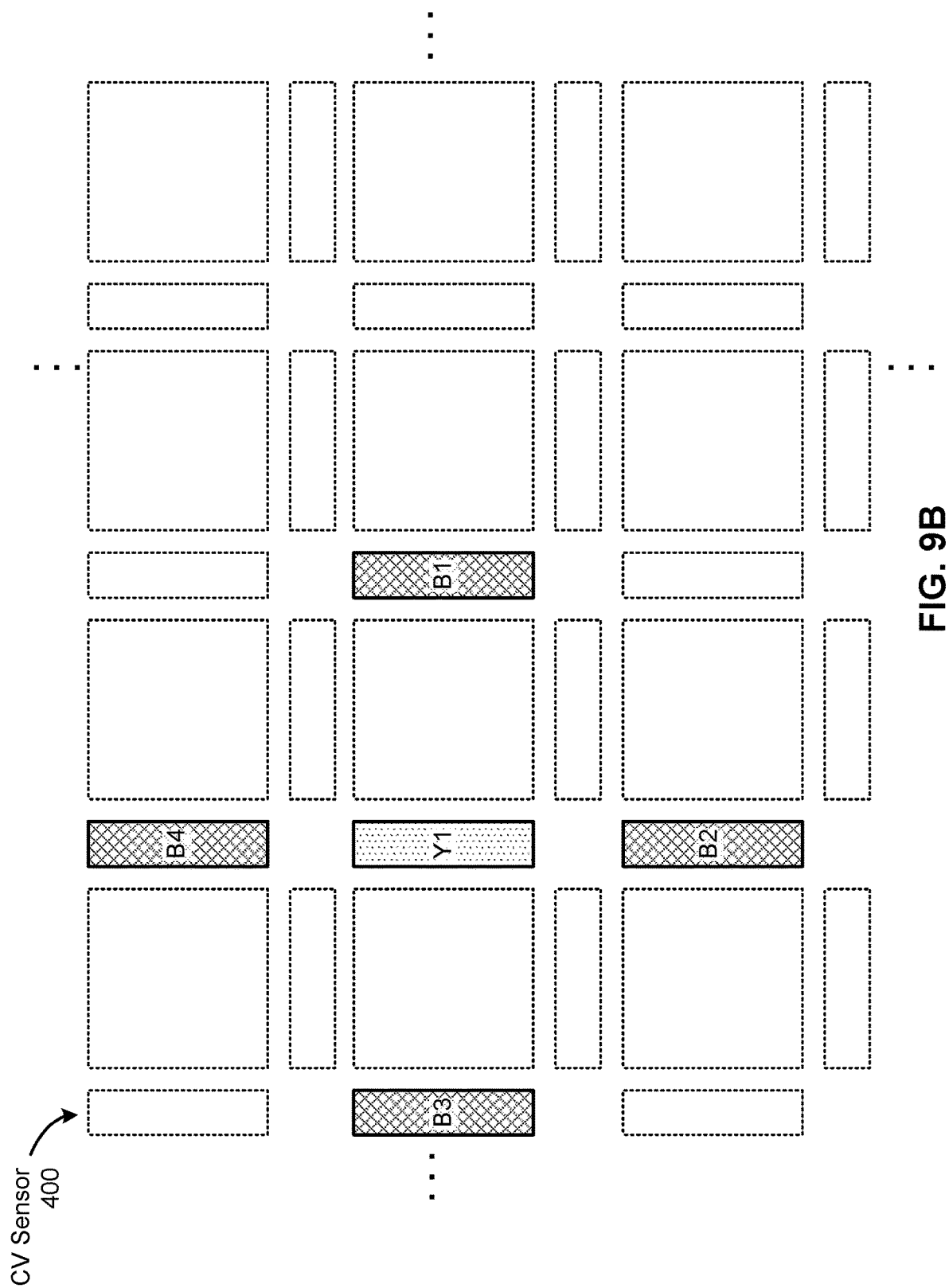

FIG. 9B illustrates the color sensors that can be utilized for the two center-surround pixels involving a center yellow color sensor Y1 surrounded by four blue color sensors B1-B4: YB_on, and YB_off. These values can be calculated as:

$$YB_{on} = Y1 - \frac{B1 + B2 + B3 + B4}{4} \tag{12}$$

and $$YB_{off} = \frac{B1 + B2 + B3 + B4}{4} - Y1. \tag{13}$$

FIG. 9C illustrates the color sensors that can be utilized for the two center-surround pixels involving a center red color sensor R1 surrounded by four green color sensors G1-G4: RG_on, and RG_off. These values can be calculated as:

$$RG_{on} = R1 - \frac{G1 + G2 + G3 + G4}{4} \tag{14}$$

and $$RG_{off} = \frac{G1 + G2 + G3 + G4}{4} - R1. \tag{15}$$

Figure 9D:
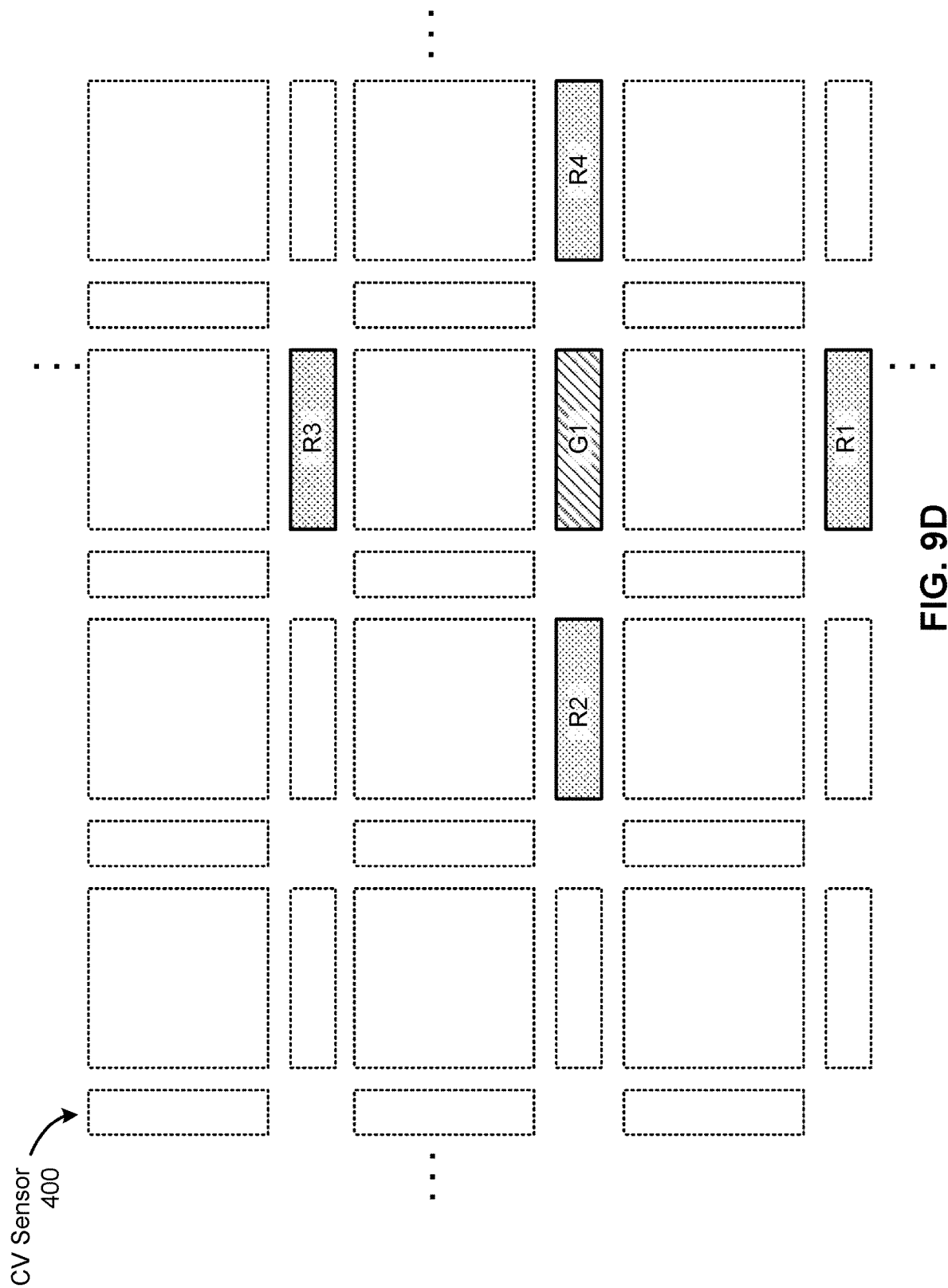

FIG. 9D illustrates the color sensors that can be utilized for the two center-surround pixels involving a center green color sensor G1 surrounded by four red color sensors R1-R4: GR_on, and GR_off. These values can be calculated as:

$$GR_{on} = G1 - \frac{R1 + R2 + R3 + R4}{4} \tag{16}$$

and $$GR_{off} = \frac{R1 + R2 + R3 + R4}{4} - G1. \tag{17}$$

Figure 10A:
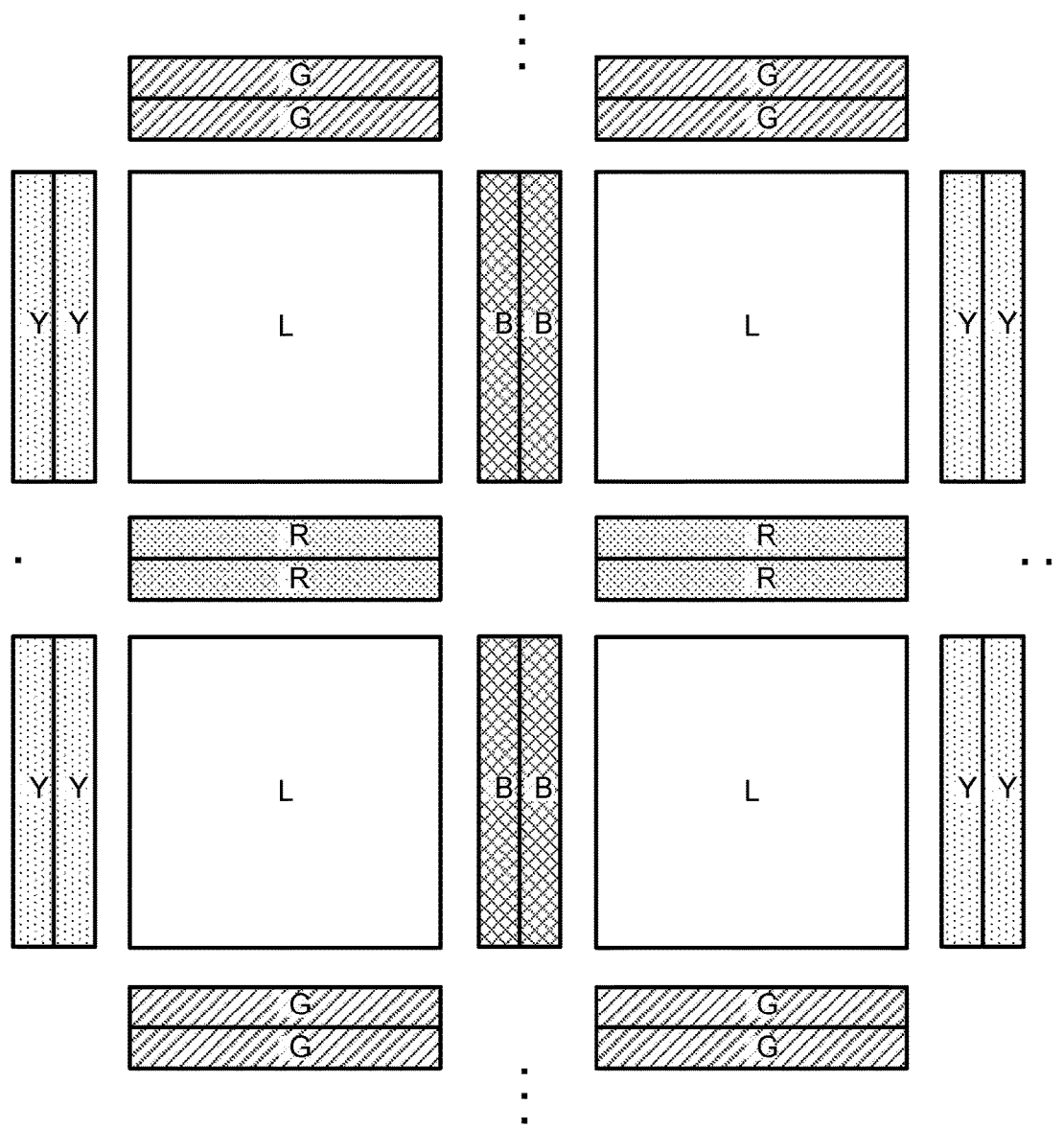
FIGS. 10A-10C are overhead views of embodiments of CV sensors providing multiple color values to help accommodate destructive reads.
Figure 10B:
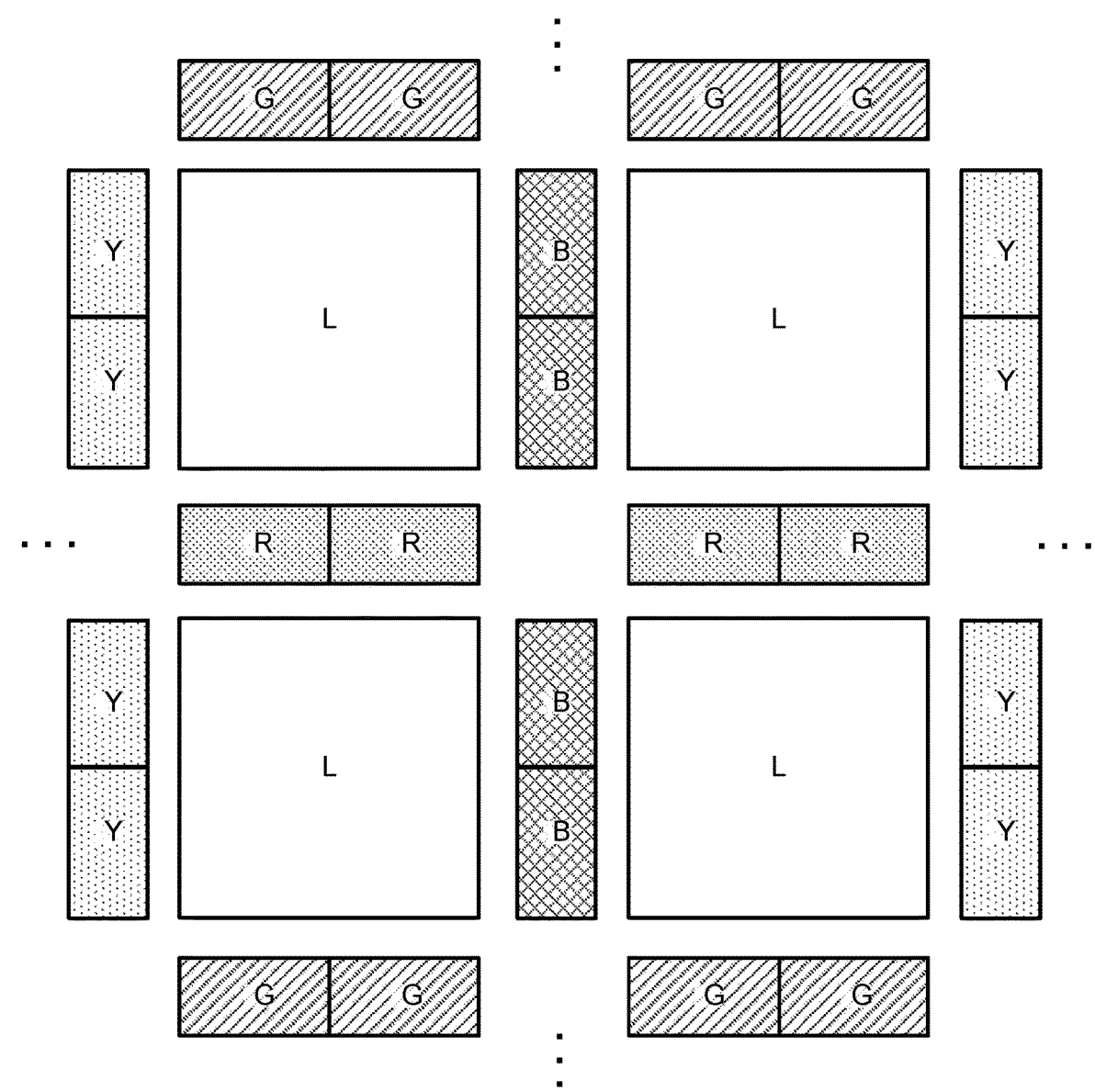
Figure 10C:
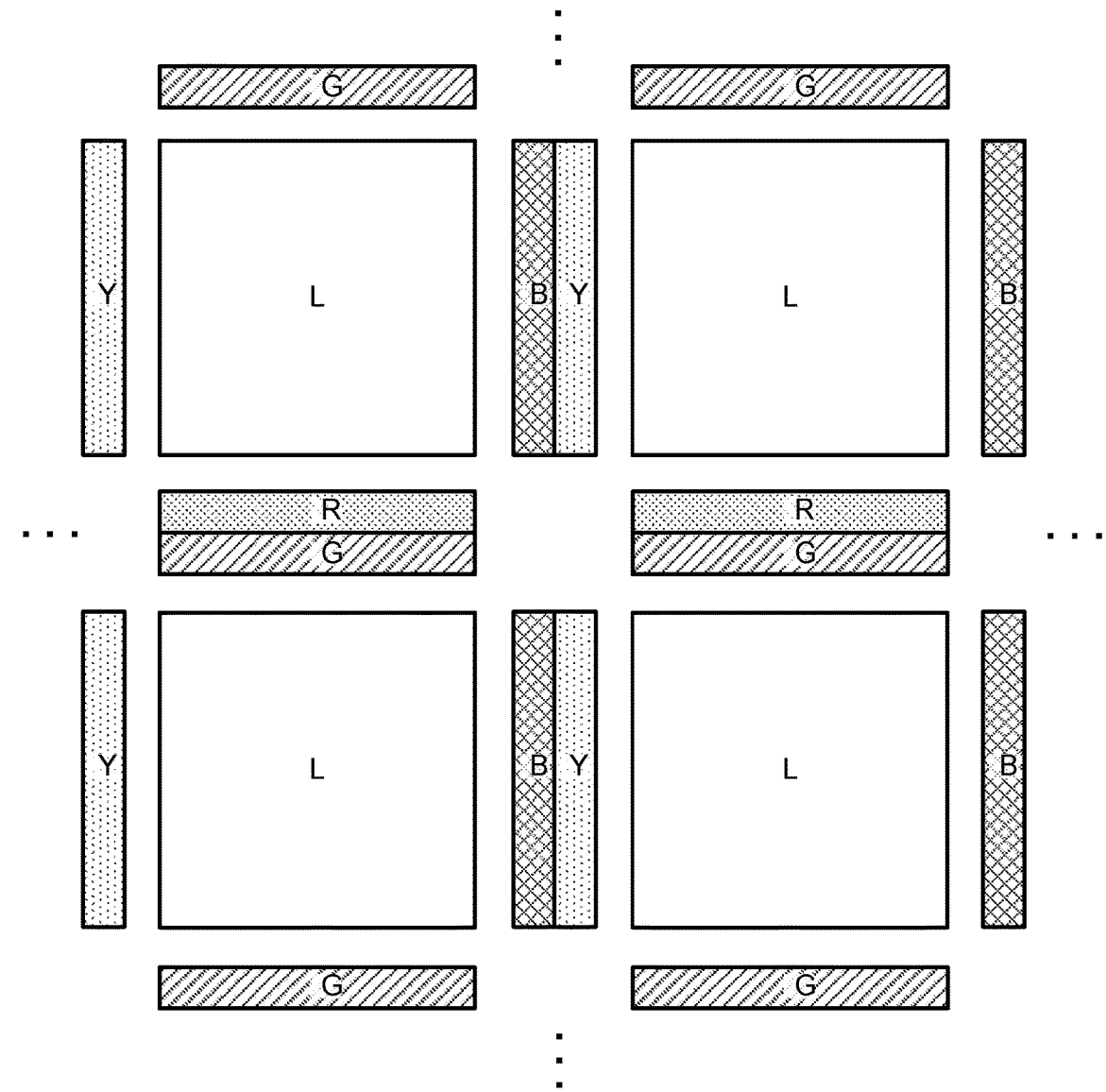

Manufacturing concerns, functionality concerns, and other considerations may result in variations in a CV sensor from the embodiments described above. FIGS. 10A-10C are examples of some variations.

FIG. 10A is an overhead view of an embodiment of a CV sensor 1000-A that takes into account to concerns in particular. First, depending on the properties of the color sensors involved, reading exposure values from color sensors can be a "destructive" reading in which the exposure values can be read only once. This can be limiting, particularly for a CV sensor operating in a plurality of modes, as described herein (low-light mode, HDR mode, center-surround, etc.). Accordingly, as is shown in FIG. 10A, a CV sensor 1000-A may have duplicative color sensors. Although duplicative color sensors are shown in FIG. 10A as two adjacent rectangular patterns, they can be interleaved or have another representation or pattern.

Second (independent from the use of duplicate color sensors), it may be cost effective to have rows and/or columns of same-color sensors, because the number and size of color filter elements in a color filter array can affect the cost. For example, as is shown in FIG. 10A, color sensors may comprise rows of R color sensors interleaved with rows of G color sensors, and columns of Y color sensors interleaved with columns of B color sensors.

FIG. 10B is an overhead view of a CV sensor 1000-B, according to another embodiment. Similar to FIG. 10A, the color sensors illustrated in FIG. 10B are both duplicative and form same-color rows and columns. However, the duplicative color sensors have a layout that is slightly different than the layout of FIG. 10A.

It can be noted that, when utilizing same-color rows and/or columns, as is illustrated in FIGS. 10A and 10B, this can cause the "mirroring" of the repeating pattern of sensors. For example, a first L sensor may have a Y color sensor immediately to its left, and a second L sensor may have a Y color sensor immediately to its right). This may impact a way in which values of the sensors are read out. Thus, the circuitry reading out the values of the sensors can be configured to accommodate this asymmetry.

FIG. 10C is an overhead view of an embodiment of a CV sensor 1000-C with duplicative color sensors, but without the "mirroring" of sensor patterns as shown in in FIGS. 10A and 10B. Here, for example, all L sensors are surrounded by Y and B color sensors to the left and right, respectively, and G and R color sensors to the top and bottom, respectively. Thus, the readout of the CV sensor 1000-C may be symmetric across all instances of this pattern of sensors. However, because rows and columns have mixed colors (columns have both B and Y color sensors, and rows have both R and G color sensors), the cost to manufacture CV sensor 1000-C may be more than the cost to manufacture CV sensor 1000-A or 1000-B.

Figure 11:
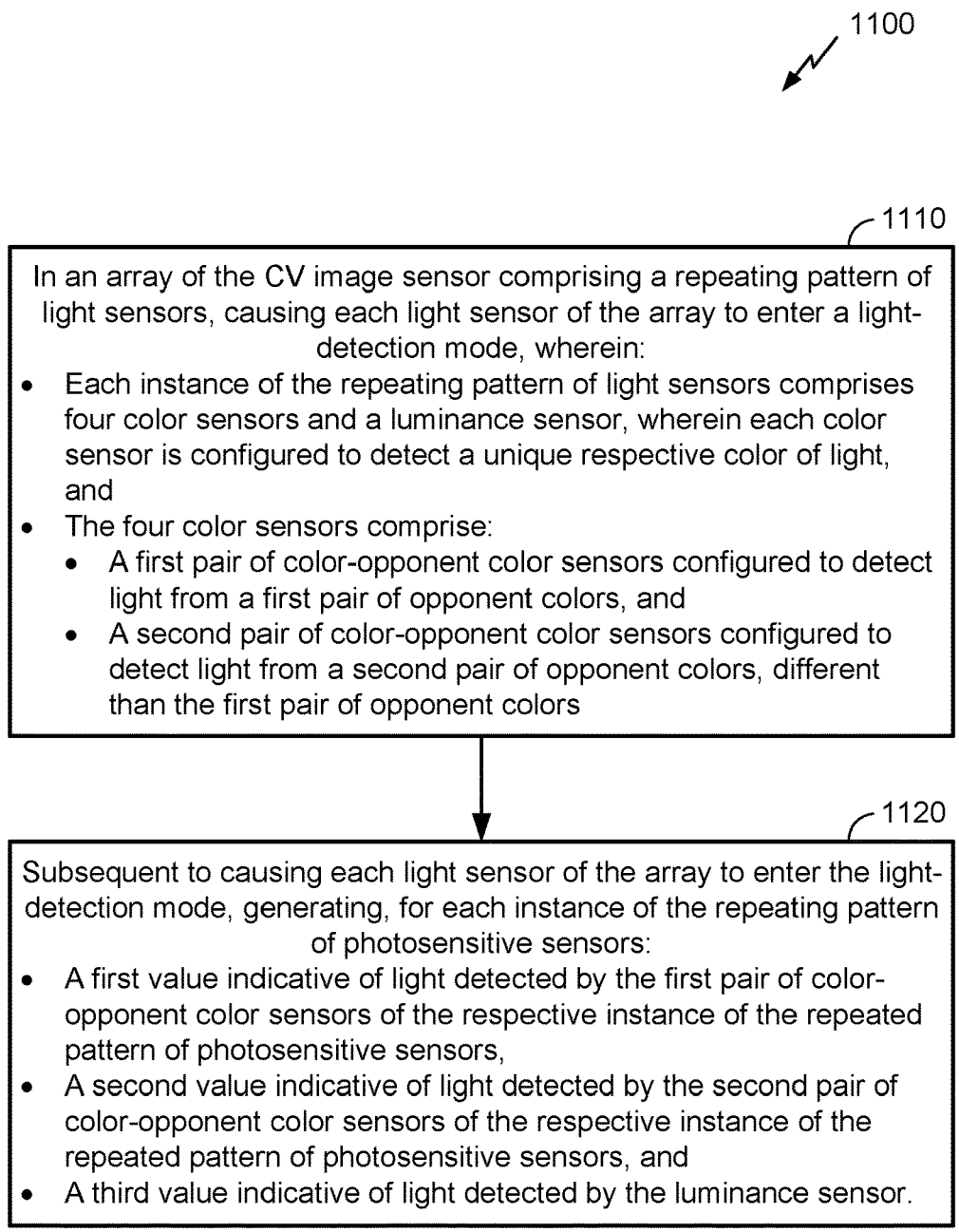
FIG. 11 is a flow diagram of a method of operating a CV image sensor, according to an embodiment.

FIG. 11 is a flow diagram of a method 1100 of operating a CV image sensor, according to an embodiment. Means for performing the functionality described in each of the blocks illustrated in FIG. 11 may comprise a CV sensor (e.g., as shown in FIGS. 4, 8, and 10A-10C), and pixel readout circuitry configured to convert sense light into a current or voltage. As a person of ordinary skill in the art will appreciate, pixel readout circuitry can comprise photo sensors (e.g., photodiodes), resistors, capacitors, buffers, etc. For color-opponent color sensors, "difference-based" or "ratio-based" values, as described in more detail above, may be generated using a variety of circuit types, including the circuitry illustrated in FIGS. 12 and 13, which are described in more detail below.

At block 1110, the functionality comprises, in an array of the CV image sensor comprising a repeating pattern of light sensors, causing each light sensor of the array to enter a light-detection mode, where each instance of the repeating pattern of light sensors comprises four color sensors and a luminance sensor, and each color sensor is configured to detect a unique respective color of light. The four color sensors comprise: a first pair of color-opponent color sensors configured to detect light from a first pair of opponent colors, and a second pair of color-opponent color sensors configured to detect light from a second pair of opponent colors, different than the first pair of opponent colors.

As illustrated in the embodiments discussed above, different aspects of the light sensors, such as the color and size, may vary depending on desired functionality. For example, in some embodiments, the first pair of color-opponent color sensors may comprise a first color sensor configured to detect blue light and a second color sensor configured to detect yellow light, and the second pair of color-opponent color sensors may comprise a third color sensor configured to detect red light, and a fourth color sensor configured to detect green light. In some embodiments, a portion of the color sensors in the array configured to detect blue light are further configured to detect ultraviolet light. Additionally or alternatively, a portion of the color sensors in the array configured to detect red light are further configured to detect infrared light. In some embodiments, a surface area of the first color sensor configured to detect blue light is larger than a surface area of the second color sensor configured to detect yellow light. Additionally or alternatively, a surface area of the fourth color sensor configured to detect green light is larger than a surface area of the third color sensor configured to detect red light. Additionally or alternatively surface area of the luminance sensor is larger than a surface area of each of the four color sensors.

At block 1120, the functionality comprises, subsequent to causing each light sensor of the array to enter the light-detection mode, generating, for each instance of the repeating pattern of photosensitive sensors, a first value indicative of light detected by the first pair of color-opponent color sensors of the respective instance of the repeated pattern of photosensitive sensors, a second value indicative of light detected by the second pair of color-opponent color sensors of the respective instance of the repeated pattern of photosensitive sensors, and a third value indicative of light detected by the luminance sensor.

As noted previously, some embodiments may utilize color sensors in a particular way in an HDR mode. In such embodiments, the electrical circuitry may be configured to generate the third value comprising a digital number, and electrical circuitry may be further configured to set a value of one or more bits (e.g., a Most Significant Byte (MSB)) of the digital number using an output value of at least one of the four color sensors. As noted above, green and yellow light sensors may be a good substitute for luminance. Thus, in some embodiments the at least one of the four color sensors comprises a first color sensor configured to detect green light, and a second color sensor configured to detect yellow light.

Embodiments may further implement a low-light functionality in which multiple luminance sensors are used, and whose output may be added to the output of a pair of color sensors. Thus, in some embodiments, the luminance sensor may comprise a first luminance sensor, and the electrical circuitry may be further configured to provide a first low-light luminance value comprising a combined value of an output of the first luminance sensor and an output of each color sensor of the first pair of color-opponent color sensors, and a second low-light luminance value comprising a combined value of an output of the second luminance sensor of the array and an output of each color sensor of the second pair of color-opponent color sensors.

According to some embodiments, first and second values provided by the electrical circuitry may represent color-opposite color channels which, as previously noted, may be "difference-based" or "ratio-based" values. Accordingly, according to some embodiments, the electrical circuitry may be configured to generate the first value using a difference in output values of color sensors in the first pair of color-opponent color sensors, and generate the second value using a difference in output values of color sensors of the second pair of color-opponent color sensors. Additionally or alternatively, the electrical circuitry may be configured to generate the first value using a ratio of output values of color sensors in the first pair of color-opponent color sensors, and generate the second value using a ratio of output values of color sensors of the second pair of color-opponent color sensors.

Other variations can include center-surround functionality and/or redundant color sensors to mitigate the effects of destructive reading. Accordingly, in some embodiments, the electrical circuitry may be further configured to generate a fourth value using an output value of a first color sensor configured to detect a first color of light of the first pair of opponent colors, and an output value of each color sensor of a plurality of surrounding color sensors, where the plurality of surrounding color sensors are disposed on the array to at least partially surround the first color sensor, and each color sensor of the plurality of surrounding color sensors is configured to detect a second color of light of the first pair of opponent colors, the second color of light being the opponent color to the first color of light. Additionally or alternatively, embodiments may mitigate against destructive reading by including additional color sensors. Thus, in some embodiments, each repeating pattern of light sensors may comprise one or more additional color sensors configured to detect the unique respective color of light of at least one of the four color sensors.

As indicated in equations (1)-(4) above, color-opponent color channels may be indicative of a ratio or difference between color-opponent pairs. As a person of ordinary skill in the art will appreciate, calculating values for these channels can be easily done in analog or digital circuitry. Circuits illustrated in FIGS. 12 and 13 provide some simple examples.

Figure 12:
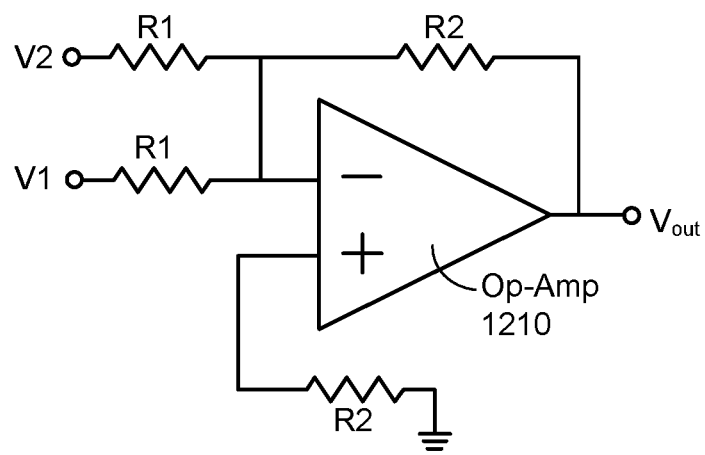
FIG. 12 is a schematic diagram of an analog subtraction circuit utilizing an op-amp, according to an embodiment.

FIG. 12 is a schematic diagram of an analog subtraction circuit utilizing an op-amp 1210, according to an embodiment. This circuit can be used, for example, to create a "difference-based" color-opponent channel according to equation (1) or (2), for example. Here voltage representing exposure values of opposite colors are provided at V1 and V2, where V_out is the output voltage equal to V1-V2, multiplied by an amplification factor of R2/R1.

The location of the circuit in FIG. 12 can vary, depending on desired functionality. In some embodiments, for example, this subtraction circuit may be located at the pixel itself (e.g., within the photo sensor array 120). In alternative embodiments (e.g., in embodiments having frame-based readout where pixel value readout may occur a row at a time), subtraction circuits may be provided in the peripheral circuitry for each column. In some embodiments, one subtraction circuit may be provided for each color-opponent pair of values from pixels in the column.

Figure 13:
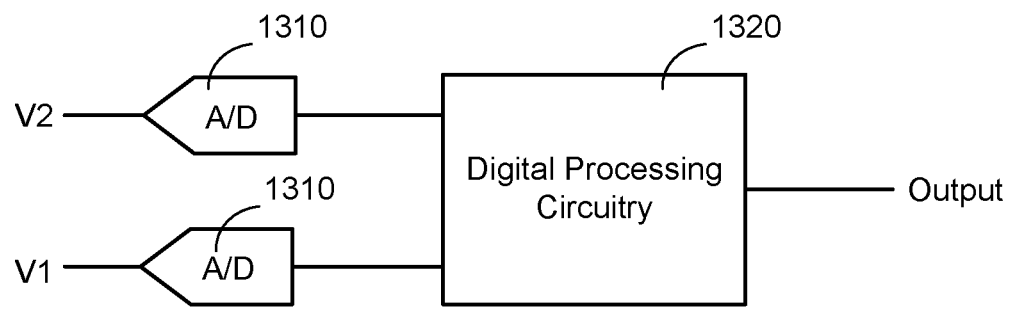
FIG. 13 is a schematic diagram of a digital color channel circuitry, according to an embodiment.

FIG. 13 is a schematic diagram of a digital color channel circuitry, according to an embodiment. Here, the functionality is generally similar to that in FIG. 12, where input voltages representing exposure values of color-opposite pairs are provided at V1 and V2. Here, however, voltages are converted from analog to digital using A/D converters 1310, and output values are then processed digitally using the digital processing circuitry 1320.

As a person of ordinary skill in the art will appreciate, the digital processing circuitry can vary, depending on desired functionality. For a "difference-based" color channel (e.g., implementing equations (1) and/or (2) above), the digital processing circuitry may comprise a digital subtractor. For a "ratio-based" color channel (e.g., implementing equations (1) and/or (2) above), the digital processing circuitry may comprise a digital divider. In either case, the Output would be a digital representation of the color-opposing color channel. Alternatively, digital processing circuitry 1320 may comprise any of a variety of digital circuits capable of providing an appropriate Output. For example, the digital processing circuitry 1320 may comprise one or more general-purpose processors, one or more special-purpose processors (such as a DSP, GPU, ASIC, FPGA, and/or the like), and/or other processing structure. Moreover, in some embodiments, the digital processing circuitry 1320 may incorporate A/D converters 1310.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including but not limited to, non-volatile media, volatile media, and transmission media. Common forms of computer-readable media include, for example, magnetic and/or optical media, any other physical medium with patterns of holes, a RAM, a PROM, EPROM, a FLASH-EPROM, any other memory chip or cartridge, a carrier wave as described hereinafter, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this Specification discussions utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this Specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or similar special purpose electronic computing devices.

Terms, "and" and "or" as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AA, AAB, AABBCCC, etc.

Having described several embodiments, various modifications, alternative constructions, and equivalents may be used without departing from the spirit of the disclosure. For example, the above elements may merely be a component of a larger system, wherein other rules may take precedence over or otherwise modify the application of the various embodiments. Also, a number of steps may be undertaken before, during, or after the above elements are considered. Accordingly, the above description does not limit the scope of the disclosure.

What is claimed is:

1. A computer vision (CV) image sensor comprising:
   an array comprising a repeating pattern of light sensors, wherein:
      each instance of the repeating pattern of light sensors comprises four color sensors and a luminance sensor, wherein each color sensor is configured to detect a unique respective color of light; and
      the four color sensors comprise:
         a first pair of color-opponent color sensors configured to detect light from a first pair of opponent colors, and
         a second pair of color-opponent color sensors configured to detect light from a second pair of opponent colors, different than the first pair of opponent colors; and
   electrical circuitry configured to provide, for each instance of the repeating pattern of light sensors:
      a first value indicative of light detected by the first pair of color-opponent color sensors of the respective instance of the repeating pattern of light sensors,
      a second value indicative of light detected by the second pair of color-opponent color sensors of the respective instance of the repeating pattern of light sensors, and
      a third value indicative of light detected by the luminance sensor.

2. The CV image sensor of claim 1, wherein:
   the first pair of color-opponent color sensors comprise a first color sensor configured to detect blue light, and a second color sensor configured to detect yellow light; and
   the second pair of color-opponent color sensors comprise a third color sensor configured to detect red light, and a fourth color sensor configured to detect green light.

3. The CV image sensor of claim 2, wherein a portion of the color sensors in the array configured to detect blue light are further configured to detect ultraviolet light.

4. The CV image sensor of claim 2, wherein a portion of the color sensors in the array configured to detect red light are further configured to detect infrared light.

5. The CV image sensor of claim 2, wherein a surface area of the first color sensor configured to detect blue light is larger than a surface area of the second color sensor configured to detect yellow light.

6. The CV image sensor of claim 2, wherein a surface area of the fourth color sensor configured to detect green light is larger than a surface area of the third color sensor configured to detect red light.

7. The CV image sensor of claim 1, wherein a surface area of the luminance sensor is larger than a surface area of each of the four color sensors.

8. The CV image sensor of claim 1, wherein:
   the electrical circuitry is configured to generate the third value comprising a digital number, and
   the electrical circuitry is configured to set a value of one or more bits of the digital number using an output value of at least one of one or more of the four color sensors.

9. The CV image sensor of claim 8, wherein the at least one of the four color sensors comprises a first color sensor configured to detect green light, and a second color sensor configured to detect yellow light.

10. The CV image sensor of claim 1, wherein:
    the luminance sensor comprises a first luminance sensor; and
    the electrical circuitry is further configured to provide:
       a first low-light luminance value comprising a combined value of an output of the first luminance sensor and an output of each color sensor of the first pair of color-opponent color sensors; and
       a second low-light luminance value comprising a combined value of an output of a second luminance sensor of the array and an output of each color sensor of the second pair of color-opponent color sensors.

11. The CV image sensor of claim 1, wherein the electrical circuitry is configured to:
    generate the first value using a difference in output values of color sensors in the first pair of color-opponent color sensors; and
    generate the second value using a difference in output values of color sensors of the second pair of color-opponent color sensors.

12. The CV image sensor of claim 1, wherein the electrical circuitry is configured to:
    generate the first value using a ratio of output values of color sensors in the first pair of color-opponent color sensors; and
    generate the second value using a ratio of output values of color sensors of the second pair of color-opponent color sensors.

13. The CV image sensor of claim 1, wherein the electrical circuitry is further configured to generate a fourth value using:
    an output value of a first color sensor configured to detect a first color of light of the first pair of opponent colors, and
    an output value of each color sensor of a plurality of surrounding color sensors, wherein:
       the plurality of surrounding color sensors are disposed on the array to at least partially surround the first color sensor; and each color sensor of the plurality of surrounding color sensors is configured to detect a second color of light of the first pair of opponent colors, the second color of light being the opponent color to the first color of light.

14. The CV image sensor of claim 1, wherein each instance of the repeating pattern of light sensors comprises one or more additional color sensors configured to detect the unique respective color of light of at least one of the four color sensors.

15. A method of operating a computer vision (CV) image sensor, the method comprising:
in an array of the CV image sensor comprising a repeating pattern of light sensors, causing each light sensor of the array to enter a light-detection mode, wherein:
each instance of the repeating pattern of light sensors comprises four color sensors and a luminance sensor, wherein each color sensor is configured to detect a unique respective color of light; and
the four color sensors comprise:
a first pair of color-opponent color sensors configured to detect light from a first pair of opponent colors, and
a second pair of color-opponent color sensors configured to detect light from a second pair of opponent colors, different than the first pair of opponent colors; and
subsequent to causing each light sensor of the array to enter the light-detection mode, generating, for each instance of the repeating pattern of photosensitive sensors:
a first value indicative of light detected by the first pair of color-opponent color sensors of the respective instance of the repeating pattern of photosensitive sensors,
a second value indicative of light detected by the second pair of color-opponent color sensors of the respective instance of the repeating pattern of photosensitive sensors, and
a third value indicative of light detected by the luminance sensor.

16. The method of claim 15, wherein:
the light detected by the first pair of color-opponent color sensors comprises blue light and yellow light; and
the light detected by the second pair of color-opponent color sensors comprises red light and green light.

17. The method of claim 16, wherein the light detected by the first pair of color-opponent color sensors further comprises ultraviolet light.

18. The method of claim 16, wherein the light detected by the second pair of color-opponent color sensors further comprises infrared light.

19. The method of claim 16, wherein a surface area of a color sensor configured to detect blue light is larger than a surface area of a color sensor configured to detect yellow light.

20. The method of claim 16, wherein a surface area of a color sensor configured to detect green light is larger than a surface area of a color sensor configured to detect red light.

21. The method of claim 15, wherein a surface area of the luminance sensor is larger than a surface area of each of the four color sensors.

22. The method of claim 15, wherein generating the third value comprises generating a digital number, and the method further comprises setting a value of one or more bits of the digital number using an output value of at least one of one or more of the four color sensors.

23. The method of claim 22, wherein the at least one of the four color sensors comprises a first color sensor configured to detect green light, and a second color sensor configured to detect yellow light.

24. The method of claim 15, wherein the luminance sensor comprises a first luminance sensor, and the method further comprises:
providing a first low-light luminance value comprising a combined value of an output of the first luminance sensor and an output of each color sensor of the first pair of color-opponent color sensors; and
providing a second low-light luminance value comprising a combined value of an output of a second luminance sensor of the array and an output of each color sensor of the second pair of color-opponent color sensors.

25. The method of claim 15, further comprising:
generating the first value using a difference in output values of color sensors in the first pair of color-opponent color sensors; and
generating the second value using a difference in output values of color sensors of the second pair of color-opponent color sensors.

26. The method of claim 15, further comprising:
generating the first value using a ratio of output values of color sensors in the first pair of color-opponent color sensors; and
generating the second value using a ratio of output values of color sensors of the second pair of color-opponent color sensors.

27. The method of claim 15, further comprising generating a fourth value using:
an output value of a first color sensor configured to detect a first color of light of the first pair of opponent colors, and
an output value of each color sensor of a plurality of surrounding color sensors, wherein:
the plurality of surrounding color sensors are disposed on the array to at least partially surround the first color sensor; and
each color sensor of the plurality of surrounding color sensors is configured to detect a second color of light of the first pair of opponent colors, the second color of light being the opponent color to the first color of light.

28. A device comprising:
an array comprising a repeating pattern of light-sensing means, wherein:
each instance of the repeating pattern of light-sensing means comprises four color-sensing means and luminance-sensing means, wherein each of the four color-sensing means comprises means for detecting a unique respective color of light; and
the four color-sensing means comprise:
a first pair of color-opponent color-sensing means configured to detect light from a first pair of opponent colors, and
a second pair of color-opponent color-sensing means configured to detect light from a second pair of opponent colors, different than the first pair of opponent colors; and
means for providing, for each instance of the repeating pattern of light-sensing means:
a first value indicative of light detected by the first pair of color-opponent color-sensing means of the respective instance of the repeating pattern of light-sensing means, a second value indicative of light detected by the second pair of color-opponent color-sensing means of the respective instance of the repeating pattern of light-sensing means, and a third value indicative of light detected by the luminance-sensing means.

29. The device of claim 28, wherein:

the first pair of color-opponent color-sensing means comprise a first color-sensing means configured to detect blue light, and a second color-sensing means configured to detect yellow light; and the second pair of color-opponent color-sensing means comprise a third color-sensing means configured to detect red light, and a fourth color-sensing means configured to detect green light.

30. A non-transitory computer-readable medium having instructions thereon for operating a computer vision (CV) image sensor, wherein the instructions, when executed by one or more processors, cause the one or more processors to:

in an array of the CV image sensor comprising a repeating pattern of light sensors, cause each light sensor of the array to enter a light-detection mode, wherein:

each instance of the repeating pattern of light sensors comprises four color sensors and a luminance sensor, wherein each color sensor is configured to detect a unique respective color of light; and the four color sensors comprise:

a first pair of color-opponent color sensors configured to detect light from a first pair of opponent colors, and a second pair of color-opponent color sensors configured to detect light from a second pair of opponent colors, different than the first pair of opponent colors; and subsequent to causing each light sensor of the array to enter the light-detection mode, generate, for each instance of the repeating pattern of photosensitive sensors:

a first value indicative of light detected by the first pair of color-opponent color sensors of the respective instance of the repeating pattern of photosensitive sensors, a second value indicative of light detected by the second pair of color-opponent color sensors of the respective instance of the repeating pattern of photosensitive sensors, and a third value indicative of light detected by the luminance sensor.

* * * * *